(12) United States Patent
Peng et al.

(10) Patent No.: US 9,536,575 B2
(45) Date of Patent: Jan. 3, 2017

(54) POWER SOURCE FOR MEMORY CIRCUITRY

(71) Applicant: MACRONIX INTERNATIONAL CO., LTD., Hsinchu (TW)

(72) Inventors: Wu-Chin Peng, Hsinchu (TW); Chun-Yi Lee, Hsinchu (TW); Ken-Hui Chen, Hsinchu (TW); Kuen-Long Chang, Hsinchu (TW); Chun Hsiung Hung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/877,692

(22) Filed: Oct. 7, 2015

(65) Prior Publication Data

US 2016/0203845 A1     Jul. 14, 2016

Related U.S. Application Data

(60) Provisional application No. 62/103,273, filed on Jan. 14, 2015.

(51) Int. Cl.
    *G11C 7/12*      (2006.01)
    *G11C 5/14*      (2006.01)

(52) U.S. Cl.
    CPC ........ *G11C 5/145* (2013.01); *G11C 7/12* (2013.01)

(58) Field of Classification Search
    CPC .................................. G11C 5/147; G11C 7/12
    USPC .................................................. 365/226, 203
    See application file for complete search history.

(56) References Cited

U.S. PATENT DOCUMENTS

| | | | |
|---|---|---|---|
| 4,912,346 A | * | 3/1990 | Mizuta .............. H03K 19/0013 273/148 B |
| 5,625,544 A | | 4/1997 | Kowshik et al. |
| 5,734,286 A | | 3/1998 | Takeyama et al. |
| 5,734,290 A | | 3/1998 | Chang et al. |
| 5,889,428 A | | 3/1999 | Young |
| 6,100,557 A | | 8/2000 | Hung et al. |
| 6,230,280 B1 | | 5/2001 | Okasaka |
| 6,366,519 B1 | | 4/2002 | Hung et al. |
| 6,476,665 B2 | | 11/2002 | Buchschacher |
| 6,525,972 B2 | | 2/2003 | Yanagisawa |
| 6,560,145 B2 | | 5/2003 | Martines et al. |
| 6,573,780 B2 | | 6/2003 | Lin et al. |

(Continued)

FOREIGN PATENT DOCUMENTS

| | | |
|---|---|---|
| CN | 1173023 A | 2/1998 |
| CN | 101317320 A | 12/2008 |
| TW | 201008098AL | 2/2010 |

*Primary Examiner* — Michael Tran
(74) *Attorney, Agent, or Firm* — Haynes Beffel & Wolfeld LLP

(57) ABSTRACT

An integrated circuit comprises a power supply input pin for receiving an off-chip supply voltage which can have a variable current, an on-chip power source to be powered by the off-chip supply voltage and which can provide a regulated current, a set of one or more circuits to be powered by at least one of the off-chip supply voltage and the on-chip power source, a configuration memory storing a set of one or more memory settings that indicate whether a circuit of said set of one or more circuits is powered by the on-chip power source, and control circuitry responsive to the at least one memory setting to control whether said circuit of said set of one or more circuits is powered by the on-chip power source.

20 Claims, 17 Drawing Sheets

(56) References Cited

U.S. PATENT DOCUMENTS

| | | |
|---|---|---|
| 6,650,172 B1 | 11/2003 | Shingyouchi |
| 6,683,809 B2 | 1/2004 | Matsuda et al. |
| 6,768,366 B2 | 7/2004 | Kuo et al. |
| 6,914,791 B1 | 7/2005 | Park et al. |
| 7,098,725 B2 | 8/2006 | Lee |
| 7,113,442 B2 | 9/2006 | Kurihara |
| 7,251,162 B2 | 7/2007 | Kawajiri et al. |
| 7,323,926 B2 | 1/2008 | Chen et al. |
| 7,327,171 B2 | 2/2008 | Wich |
| 7,443,739 B2 | 10/2008 | Barth |
| 7,502,267 B2 | 3/2009 | Lin et al. |
| 7,525,853 B2 | 4/2009 | Kitazaki et al. |
| 7,595,682 B2 | 9/2009 | Lin et al. |
| 7,808,301 B2 | 10/2010 | Chen et al. |
| 7,944,718 B2 | 5/2011 | Takano |
| 8,339,185 B2 | 12/2012 | Cazzaniga et al. |
| 9,214,859 B2 | 12/2015 | Lin et al. |
| 2002/0114184 A1* | 8/2002 | Gongwer ............... G11C 5/14 365/185.11 |
| 2007/0096796 A1 | 5/2007 | Firmansyah et al. |
| 2007/0126494 A1 | 6/2007 | Pan |
| 2008/0316834 A1* | 12/2008 | Chae ..................... G11C 8/08 365/185.23 |
| 2009/0108915 A1 | 4/2009 | Liao |
| 2010/0171544 A1* | 7/2010 | Seo ...................... H02M 3/07 327/536 |
| 2010/0237931 A1 | 9/2010 | Ogiwara et al. |
| 2011/0115551 A1 | 5/2011 | Hung et al. |
| 2012/0049937 A1 | 3/2012 | El Waffaoui |
| 2012/0275225 A1 | 11/2012 | Huynh et al. |
| 2013/0027120 A1 | 1/2013 | Lo et al. |
| 2013/0127436 A1 | 5/2013 | Hu et al. |
| 2013/0205141 A1* | 8/2013 | Solihin ................ G06F 1/3225 713/300 |
| 2014/0189407 A1* | 7/2014 | Byun .................. G06F 1/3275 713/323 |
| 2016/0203846 A1 | 7/2016 | Peng et al. |

* cited by examiner

CHARGE PUMP STAGE 400

CHARGE PUMP STAGE 500

CHARGE PUMP STAGE 600

POWER SOURCE FOR MEMORY CIRCUITRY

PRIORITY APPLICATION

This application claims the benefit of U.S. Provisional Patent Application No. 62/103,273, filed 14 Jan. 2015 entitled Regulate Power Source of Charge Pump for Low Power Application. This application is incorporated by reference herein.

BACKGROUND

Field of the Invention

This technology relates to power sources for memory circuitry such as charge pumps.

Description of Related Art

As process sizes continue to shrink for nonvolatile memory such as flash memory, lowering power consumption of the memory circuitry becomes even more critical. Power consumption of memory circuitry is determined by current consumption, because power=voltage×current=current$^2$×resistance.

Certain types of memory circuitry rely on a higher supply voltage than the lower supply voltage provided as an input to the integrated circuit which includes the memory array. Examples of such circuitry include charge pumps and output drivers.

Charge pumps and output drivers also draw relatively large peak currents. Voltage boosting circuits and multi-phase clocks are example of other types of memory circuitry that draw relatively large peak currents, and which may or may not rely on a higher supply voltage.

Such types of circuitry that rely on a higher supply voltage than the lower voltage supplied to the integrated circuit, and/or that draw relatively large peak currents, consume varying amounts of power. Peak powers can damage the power source of the integrated circuit which includes the memory array.

It would be desirable to control peak power consumption of an integrated circuit.

SUMMARY

Various embodiments of the technology control the peak power consumption, by providing a regulated current to high current/high power parts of an integrated circuit.

One aspect of the technology is an integrated circuit comprising a power supply input pin, an on-chip power source, a configuration memory storing a set of one or more circuits to be powered by at least one of the off-chip supply voltage and the on-chip power source, a set of one or more memory settings, and control circuitry.

The power supply input pin is for receiving an off-chip supply voltage, which can have a variable current. The on-chip power source is to be powered by the off-chip supply voltage. The set of one or more memory settings indicate whether at least one circuit of said set of one or more circuits is powered by the on-chip power source. The control circuitry is responsive to the set of one or more memory settings to control whether said at least one circuit is powered by the on-chip power source.

In one embodiment of the technology, the set of one or more circuits includes a charge pump driven by a multi-phase clock signal, the multi-phase clock signal having a voltage-versus-time slope determined by a regulated current, which can be provided by the on-chip power source. In various embodiments of the technology, the charge pump includes a plurality of serially coupled charge pump stages arranged to pump charge from a first stage to a last stage of the plurality. The charge pump stages of the plurality include an input node, an output node, a pass transistor electrically coupling the input node and the output node, a first boost capacitor coupled to the output node, and a second boost capacitor coupled to a gate of the pass transistor.

In some embodiments of the technology, the memory settings indicate whether at least one of: (i) the first boost capacitors, (ii) the second boost capacitors, and (iii) the input node of a first stage are powered by the on-chip power source providing a regulated current.

In some embodiments of the technology, a particular stage of the charge pump stages includes a first transistor selectively electrically coupling an input node of the particular stage and an output node of the particular stage, and a second transistor selectively electrically coupling the input node and a gate of the first transistor.

In some embodiments of the technology, the particular stage is in a well surrounded by a plurality of well contacts.

In some embodiments of the technology, the input node is defined by a first region in the well. The output node is defined by a second region in the well. The first region and the second region are on opposite sides of the gate of the first transistor. The first region has a first distance from a nearest one of the plurality of well contacts averaged along a first perimeter of the first region. The second region has a second distance from another nearest one of the plurality of well contacts averaged along a second perimeter of the first region. The first distance is longer than the second distance.

In some embodiments of the technology, the input node is defined by a first region in the well. The output node is defined by a plurality of second regions in the well. The first region is in between the plurality of second regions.

In some embodiments of the technology, the on-chip power source includes a plurality of parallel current sources. The integrated circuit apparatus includes an additional set of one or more memory settings that indicate whether a particular parallel current source of the plurality of parallel current sources provides current that is included in a regulated current that can be provided by the on-chip power source.

In some embodiments of the technology, the on-chip power source includes a reference current source, and a plurality of transistors having at least two different widths. At least a first one of the plurality of transistors is in series with the reference current source. At least a second one of the plurality of transistors provides an output current determined by a ratio of the different widths of at least the first and the second ones of the plurality of transistors.

In some embodiments of the technology, the on-chip power source includes an operational amplifier in a loop from a gate of at least the first one of the plurality of transistors to the reference current source.

In some embodiments of the technology, the on-chip power source has a nominal output voltage that is independent of the off-chip supply voltage.

In some embodiments of the technology, the set of one or more circuits includes a capacitive boosting circuit.

In some embodiments of the technology, the set of one or more circuits includes an output driver.

In some embodiments of the technology, the set of one or more circuits includes a clock circuit.

One embodiment further comprises a semiconductor body having a particular conductivity type; a first well in said semiconductor body having said particular conductivity type; a second well in said semiconductor body surrounding said first well and having an opposite conductivity type relative to the particular conductivity type; a plurality of transistors arranged to pump a voltage level from a first transistor to a last transistor in response to one or more clock signals, said last transistor having a voltage level substantially higher than, or negative relative to, a power supply voltage coupled to said plurality of transistors; and at least one of said plurality of transistors having a source and a drain region of said opposite conductivity type formed in said first well, said first well, said second well and said drain region being coupled to a common potential, wherein the set of one or more circuits includes the plurality of transistors.

Another aspect of the technology is a method comprising: accessing a set of one or more memory settings that indicate whether at least one circuit of a set of one or more circuits is powered by an on-chip power source providing a regulated current, the on-chip power source powered by an off-chip supply voltage via a power supply input pin having a variable current; and responsive to the set of one or more memory settings, controlling whether said at least one circuit is powered by the on-chip power source.

Various embodiments are disclosed herein.

DETAILED DESCRIPTION

Figure 1:
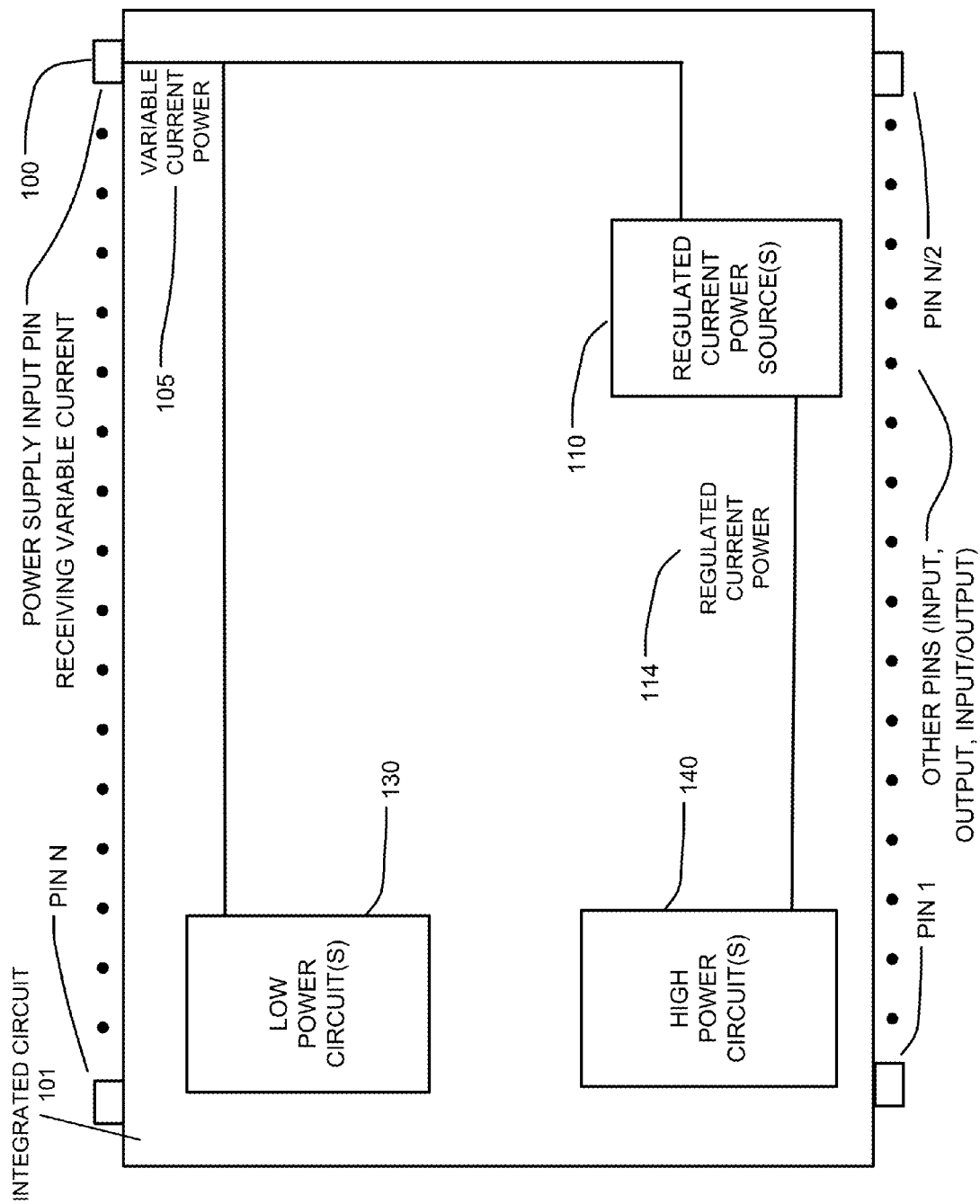
FIG. 1 is a block diagram of an integrated circuit that receives external power with variable current, and internally generates regulated current power for high power circuits.

FIG. 1 is a block diagram of an integrated circuit that receives external power with variable current, and internally generates regulated current power for high power circuits.

In FIG. 1, integrated circuit 101 is a in a package with pins numbered 1 to N that receive and send signals, and receive power. Pin 100 is a power supply input pin receiving variable current, typically at a fixed nominal voltage or voltage range. As the internal circuits of integrated circuit 101 draw varying amounts of power or current, the total current drawn through pin 100 varies. The variable current power 105 drawn through power supply input pin 100 is received by low power circuit(s) 130 and regulated current power source(s) 110. Although the current drawn by low power circuit(s) 130 varies with time, the maximum current drawn by low power circuit(s) 130 is less than the regulated current generated by regulated current power source(s) 110. Accordingly, peaks in the variable current power consumed by low power circuit(s) 130 do not damage the external power supply which provides pin 100 with power. The current drawn through pin 100 that is consumed by regulated current power source(s) 110 is also a regulated current.

High power circuit(s) 140 draw on regulated current generated by regulated current power source(s) 110. Because the peak current that can be drawn by high power circuit(s) 140 is limited by the regulated current, peaks in the total power consumption of the integrated circuit 101 will not damage the external power supply which provides pin 100 with power. When the regulated current generated by regulated current power source(s) 110 is not consumed by high power circuit(s) 140, then the regulated current power source(s) 110 stops generating current.

Integrated circuit 101 is designed so that the regulated current is sufficient, based on the consumed current or the maximum peak current of the system specification.

Figure 2:
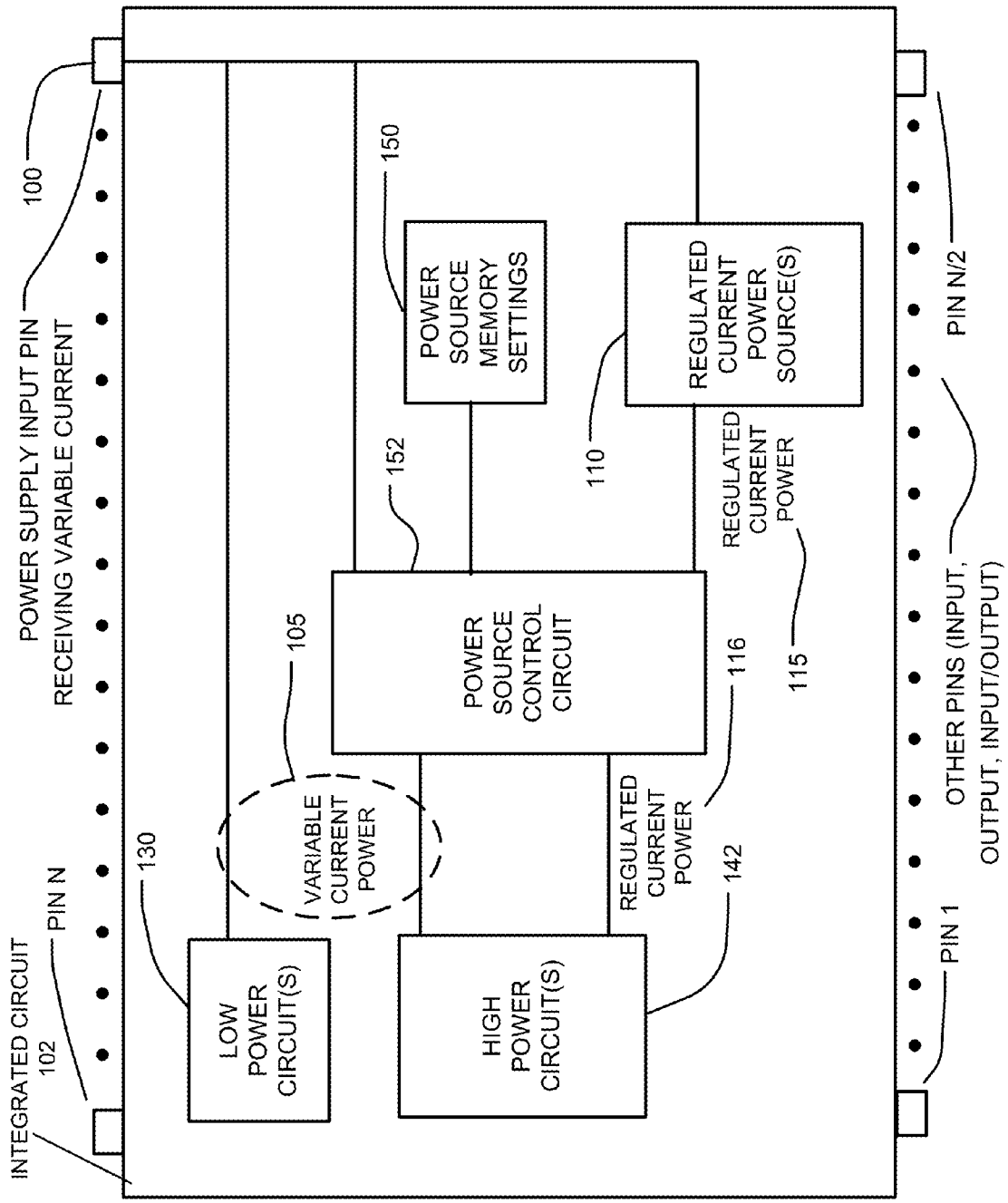
FIG. 2 is a block diagram of an integrated circuit, similar to FIG. 1, that receives external power with variable current, internally generates regulated current power, and switches the power source of high power circuits between variable current power and regulated current power.

FIG. 2 is a block diagram of an integrated circuit 102, similar to FIG. 1, that receives external power with variable current, internally generates regulated current power, and switches the power source of high power circuits between variable current power and regulated current power.

Power source memory settings 150 store preferences on whether particular ones high power circuit(s) 142 or parts thereof draw power from the variable current power 105 supplied by power supply input pin 100, or the regulated current power 115 supplied by regulated current power source(s) 110. The affected particular high power circuit(s) 142 can be a subset or all of the high power circuit(s) 142. The power source memory settings 150 can be nonvolatile memory such as fuses, flash, or nitride charge trapping cells, or volatile memory such as RAM. The power source control circuit 152, depending on the contents of power source memory settings 150, controls whether particular high power circuit(s) 142 or parts thereof draw power from the variable current power 105 supplied by power supply input pin 100, or the regulated current power 115 supplied by regulated current power source(s) 110. Power source memory settings 150 and power source control circuit 152, add flexibility as to the amount and type of high power circuit(s) 142 which draw on the regulated current power 115 from regulated current power source(s) 110. An example of a power source control circuit includes a switch circuit with multiple selectable current paths. An example of power source memory settings 150 has memory elements such as fuses, or deposited metal to select the current path.

Figure 3:
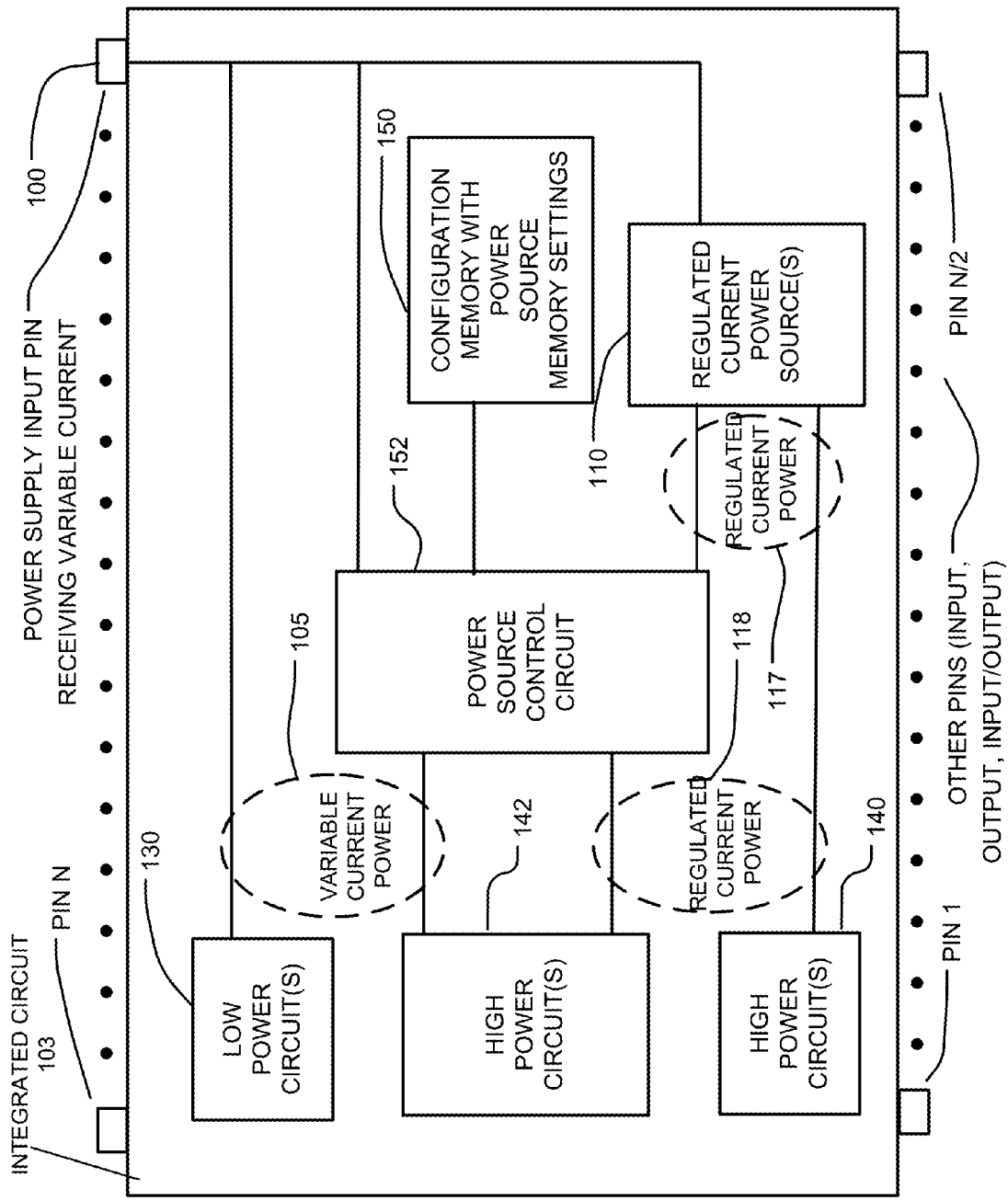
FIG. 3 is a block diagram of an integrated circuit, similar to FIGS. 1 and 2, that receives external power with variable current, internally generates regulated current power, and switches the power source of only some high power circuits between variable current power and regulated current power.

FIG. 3 is a block diagram of an integrated circuit 103, similar to FIGS. 1 and 2, that receives external power with variable current, internally generates regulated current power, and switches the power source of only some high power circuits between variable current power and regulated current power.

Integrated circuit 103 includes both high power circuit(s) 140 as in FIG. 1 and high power circuit(s) 142 as in FIG. 2. High power circuit(s) 140 draw on the regulated current 117 generated from regulated current power source(s) 110 regardless of the contents of power source memory settings 150. On the other hand, high power circuit(s) 142 draw power from the variable current power 105 from power supply input pin 100, or the regulated current power 115 from regulated current power source(s) 110, depending on the preferences stored in power source memory settings 150.

On the one hand, power source memory settings 150 and power source control circuit 152, add flexibility as to the amount and type of high power circuit(s) 142 which draw on the regulated current power 115 from regulated current power source(s) 110. On the other hand, by fixing high power circuit(s) 140 to draw on the regulated current 117 generated from regulated current power source(s) 110, complexity is reduced for power source memory settings 150 and power source control circuit 152

In some embodiments, the regulated current power source provides one total output current which is constant. In other embodiments, the regulated current power source provides multiple output currents, each of which is constant. The multiple output currents can have same values or different values.

Figure 4:
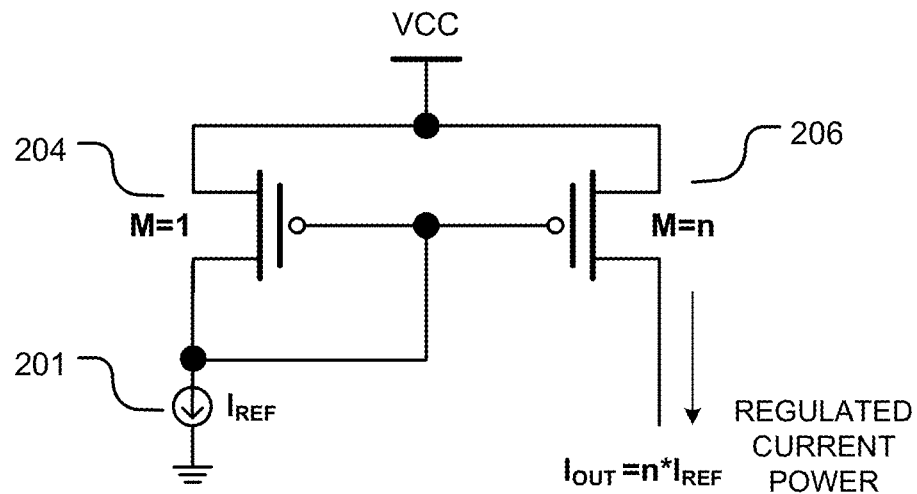
FIG. 4 is a simplified circuit diagram of a power source that generates regulated current that is scaled from a regulated current source.

FIG. 4 is a simplified circuit diagram of a power source that generates regulated current that is scaled from a regulated current source.

The reference current source 201 generates a reference current that is scaled by the regulated current power source. The reference current source 201 can be a Vcc supply voltage independent current source. Other example reference current sources can include a temperature-independent reference and/or a bandgap reference. A diode-connected p-type transistor 204 is coupled between supply voltage VCC and current reference IREF 201. Current reference IREF 201 is coupled between p-type transistor 204 and a reference voltage such as ground. P-type transistor 206 has a source coupled to supply voltage VCC, a gate coupled to the cathode of diode-connected p-type transistor 204, and a drain which provides an output of regulated current power. This current output scales the current of reference current source 201 by the ratio of the widths of p-type transistor 206 and p-type transistor 204.

Figure 4A:
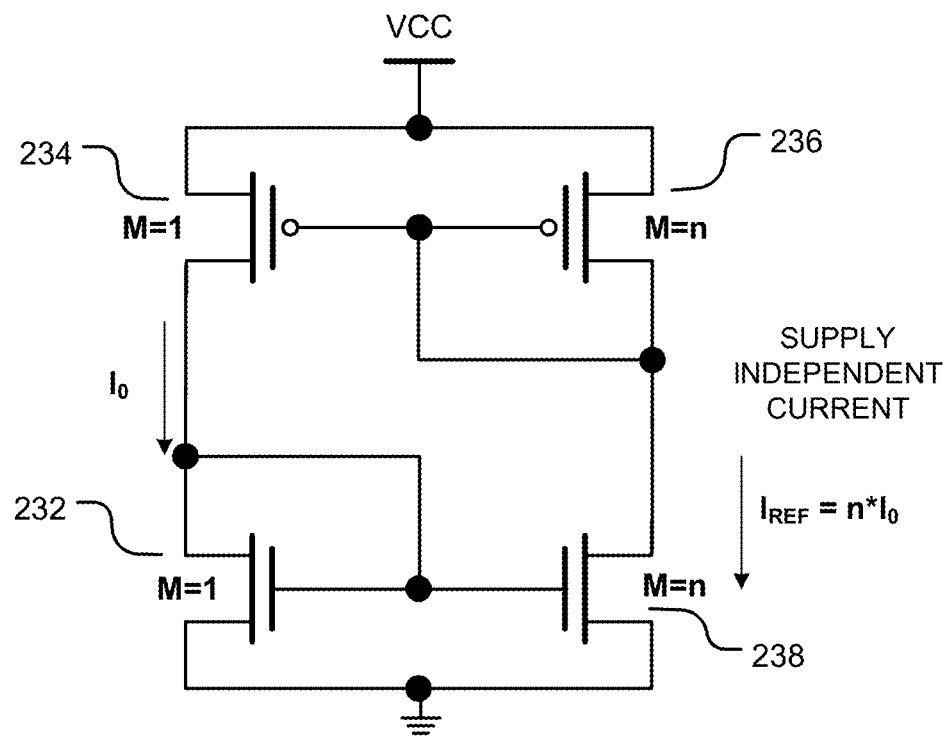
FIG. 4A is a simplified circuit diagram of an example supply voltage independent current source that can be used in the current source of FIGS. 4 and 5.
Figure 5:
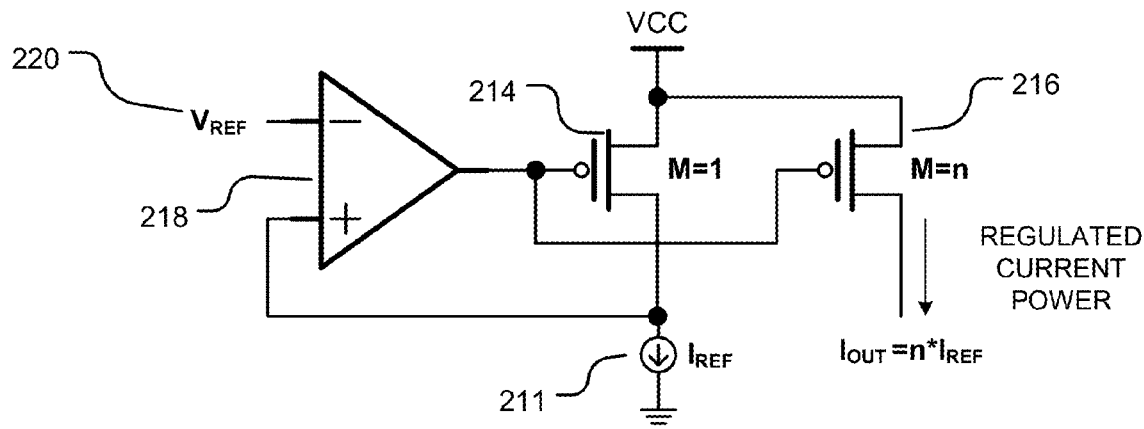
FIG. 5 is a simplified circuit diagram of a power source including an op amp that generates regulated current that is scaled from a regulated current source.

FIG. 4A is a simplified circuit diagram of an example supply voltage independent current source that can be used in a regulated current power source such as FIGS. 4 and 5.

An example supply voltage independent current source has a first pair of series-coupled transistors between a supply voltage and another reference voltage such as ground. The first pair of series-coupled transistors includes first p-type transistor 234 and first n-type transistor 232. The example supply voltage independent current source also has a second pair of series-coupled transistors between the supply voltage and ground. The second pair of series-coupled transistors includes second p-type transistor 236 and second n-type transistor 238. The first n-type transistor 232 has a source coupled to ground. The first n-type transistor 232 has a gate and a drain coupled to each other, to a gate of the second n-type transistor 238, and to a drain of the first p-type transistor 234. The first p-type transistor 234 has a source coupled to the supply voltage and a gate coupled to a gate and a drain of the second p-type transistor 236. The second p-type transistor 236 has a source coupled to the supply voltage. The second p-type transistor 236 has the gate and the drain coupled to each other, to the gate of the first p-type transistor, and to a drain of the second n-type transistor 238. The second n-type transistor 238 has a source coupled to ground, a gate coupled to the gate and the drain of the second p-type transistor 236, and a drain coupled to the gate and the drain of the second p-type transistor 236. The example supply voltage independent current source can define the currents with a series resistance in between the second p-type transistor 236 and the supply voltage, and/or in between the second n-type transistor 238 and ground.

FIG. 5 is a simplified circuit diagram of a power source including an op amp that generates regulated current that is scaled from a regulated current source.

The reference current source 211 generates a reference current that is scaled by the regulated current power source. The reference current source 211 can be a Vcc supply voltage independent current source. Other example reference current sources can include a temperature-independent reference and/or a bandgap reference. A p-type transistor 214 is coupled in series between supply voltage VCC and current reference IREF 211. Current reference IREF 211 is coupled between p-type transistor 214 and a reference voltage such as ground. P-type transistor 216 has a source coupled to supply voltage VCC, a gate coupled to the gate of p-type transistor 214, and a drain which provides an output of regulated current power. This current output scales the current of reference current source 211 by the ratio of the widths of p-type transistor 216 and p-type transistor 214.

An operation amplifier 218 has an inverting input coupled to voltage reference VREF 220, a noninverting input coupled to a node between current reference IREF 211 and the drain of p-type transistor 214, and an output coupled to the gates of p-type transistor 216 and p-type transistor 214. An example of voltage reference VREF 220 includes a bandgap reference or a scaled output of a bandgap reference.

Figure 6:
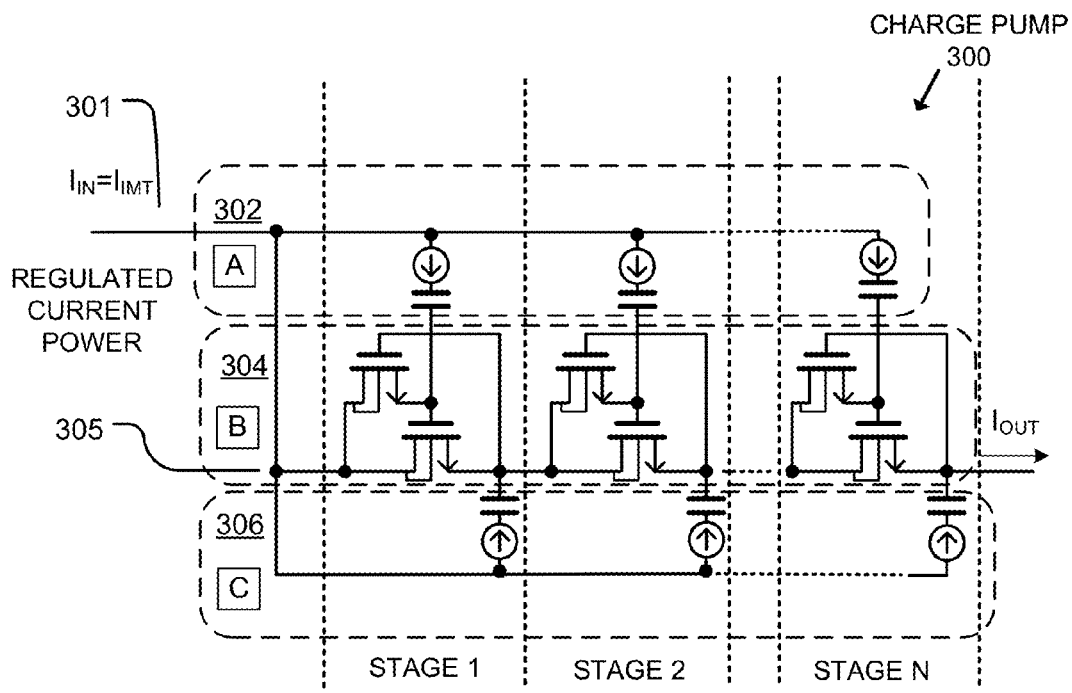
FIG. 6 is a simplified circuit diagram of a multi-stage charge pump powered by a regulated current source.

FIG. 6 is a simplified circuit diagram of a multi-stage charge pump 300 powered by a regulated current source.

The multi-stage charge pump is an example of a high-power circuit that can be powered by regulated current power source 301. Details of a typical charge pump stage are discussed in connection with FIG. 10. Each stage of a charge pump includes boost drive 302 (also labeled A) for the pass transistor powered by a current source, the pumped nodes and main transistors 304 (also labeled B), and the boost capacitor 306 (also labeled C) powered by a current source. The boost drive 302 and boost capacitor 306 of a charge pump stage are noted for high power/high current consumption, and draw power from regulated current power source 301. Also, the first stage of the charge pump has an input node 305 noted for high power/high current consumption, that also draws power from regulated current power source 301.

Figure 7:
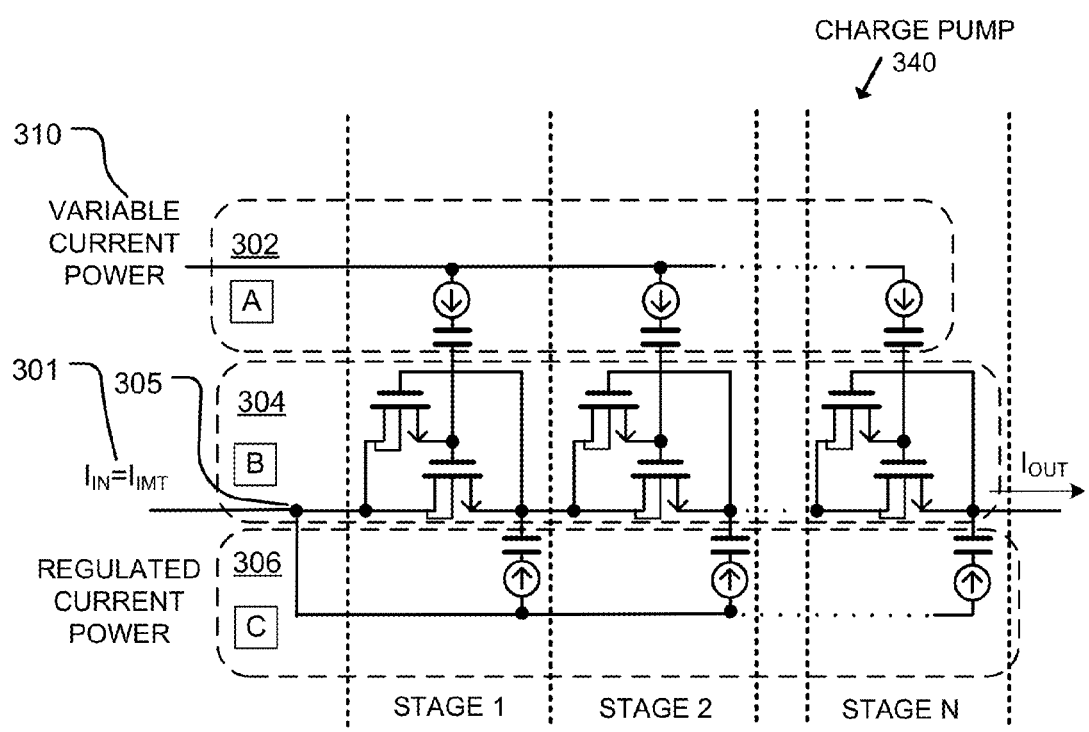
FIG. 7 is a simplified circuit diagram of a multi-stage charge pump powered by a regulated current source and a variable current source.

FIG. 7 is a simplified circuit diagram of a multi-stage charge pump 340 powered by a regulated current source and a variable current source.

Unlike the multi-stage charge pump of FIG. 6, only some of the high power/high current parts of the multi-stage charge pump draw power from regulated current power source 301. The first stage of the charge pump has an input node 305 that draws power from regulated current power source 301. Boost capacitor 306 for all stages (also labeled C) also draws power from regulated current power source 301. However, boost drive 302 for all stages (also labeled A) for the pass transistor draws power from the variable current power source 310.

Figure 8:
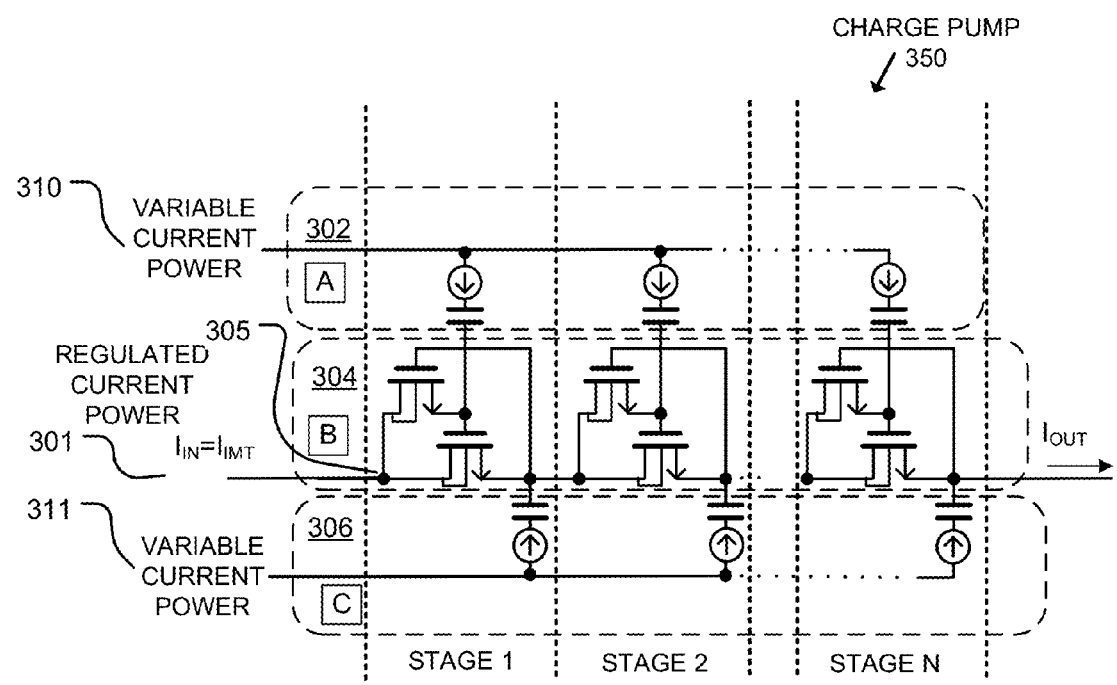
FIG. 8 is a simplified circuit diagram of a multi-stage charge pump powered by a regulated current source and a variable current source, with an assignment of charge pump components to the regulated current source and the variable current source that varies from FIG. 7.

FIG. 8 is a simplified circuit diagram of a multi-stage charge pump 350 powered by a regulated current source and a variable current source, with an assignment of charge pump components to the regulated current source and the variable current source that varies from FIG. 7.

The first stage of the charge pump has an input node 305 draws power from regulated current power source 301. However, boost drive 302 for all stages (also labeled A) for the pass transistor draws power from the variable current power source 310. Also, boost capacitor 306 for all stages (also labeled C) also draws power from variable current power source 310.

Other embodiments are directed to the other combinations of assignments of charge pump components to the regulated current source and the variable current source.

Figure 9:
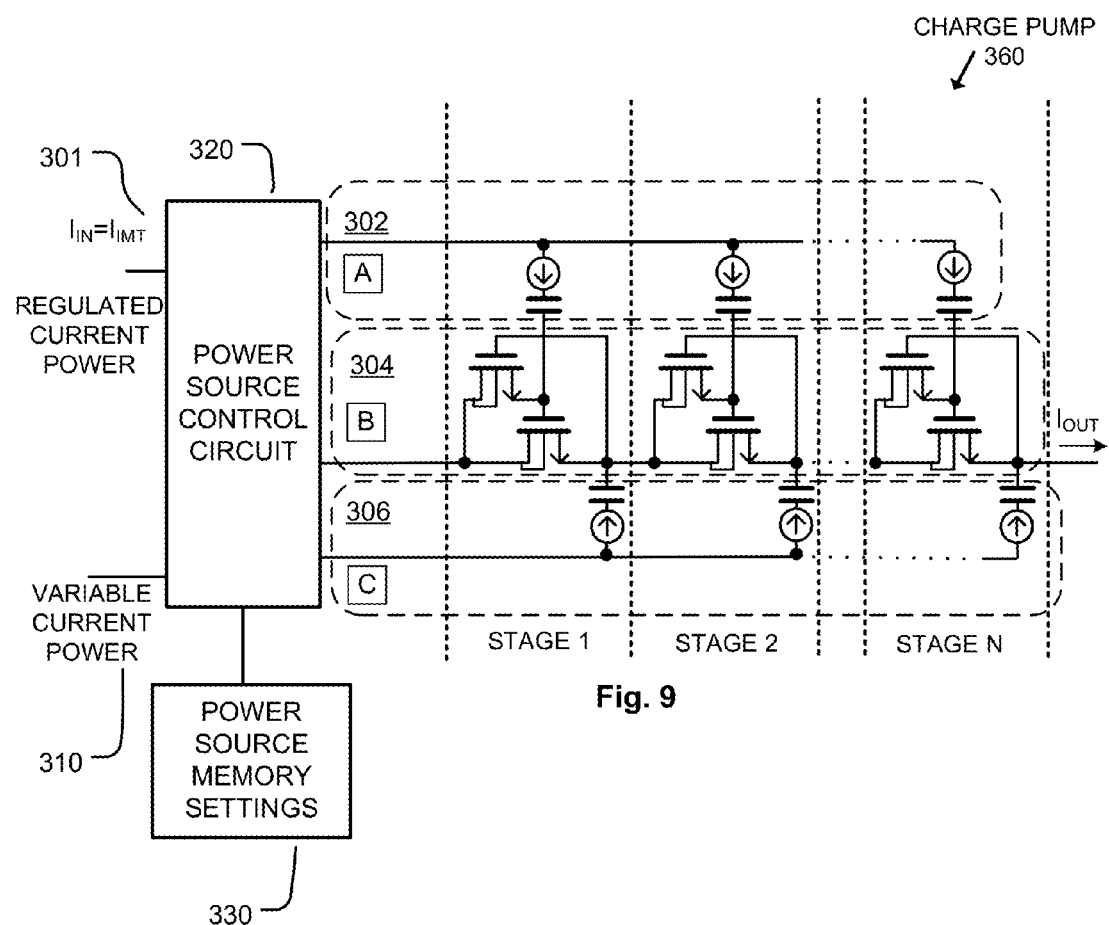
FIG. 9 is a simplified circuit diagram of a multi-stage charge pump powered by a regulated current source and a variable current source, with an assignment of charge pump components to the regulated current source and the variable current source that is controlled by memory settings.

FIG. 9 is a simplified circuit diagram of a multi-stage charge pump 360 powered by a regulated current source and a variable current source, with an assignment of charge pump components to the regulated current source and the variable current source that is controlled by memory settings.

Power source memory settings 330 store preferences on whether particular charge pump circuits draw power from the variable current power 310, or the regulated current power 301 from regulated current power source 301. Responsive to power source memory settings 330, power source control circuit 320 controls whether boost drive 302 for all stages (also labeled A) for the pass transistor, the pumped nodes and main transistors 304 for the first stage (also labeled B), and the boost capacitor 306 for all stages (also labeled C) draw power from the variable current power 310, or the regulated current power 301 from regulated current power source 301.

In other embodiments, parts of the charge pump draw power for a power source responsive to power source memory settings 330, and other parts of the charge pump draw power permanently draw power from variable current power 310. Alternatively, parts of the charge pump draw power for a power source responsive to power source memory settings 330, and other parts of the charge pump draw power permanently draw power from regulated current power 301. In a further alternative, parts of the charge pump draw power for a power source responsive to power source memory settings 330, other parts of the charge pump draw power permanently draw power from variable current power 310, and yet other parts of the charge pump draw power permanently draw power from regulated current power 301.

Figure 10:
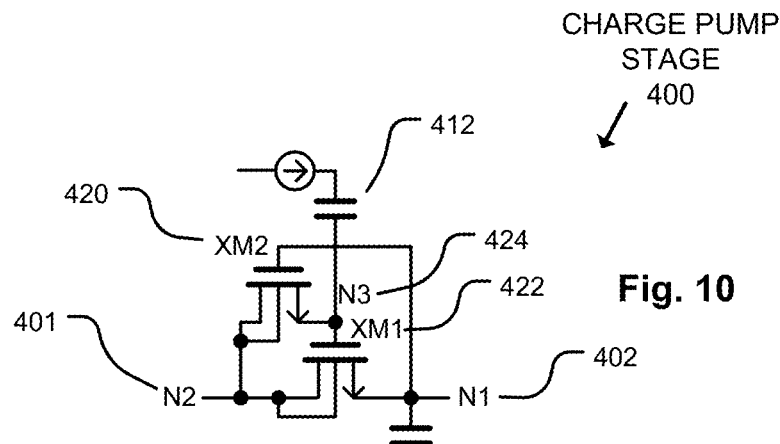
FIG. 10 is a simplified circuit diagram of a stage of a multi-stage charge pump powered by a regulated current source and a variable current source according to FIG. 7, 8, or 9.

FIG. 10 is a simplified circuit diagram of a stage of a multi-stage charge pump powered by a regulated current source and a variable current source according to FIG. 7, 8, or 9.

Transistor XM1 422 selectively electrically couples input node N2 401 and output node N1 402. Transistor XM2 420 selectively electrically couples input node N2 401 and the gate of transistor XM1, node N3 424. Capacitor 412 is the boost drive for node N3, powered by a current source. Capacitor 432 is the boost capacitor for node N1 402, powered by a current source. Capacitor 432 is driven by inverter 430.

Figure 11:
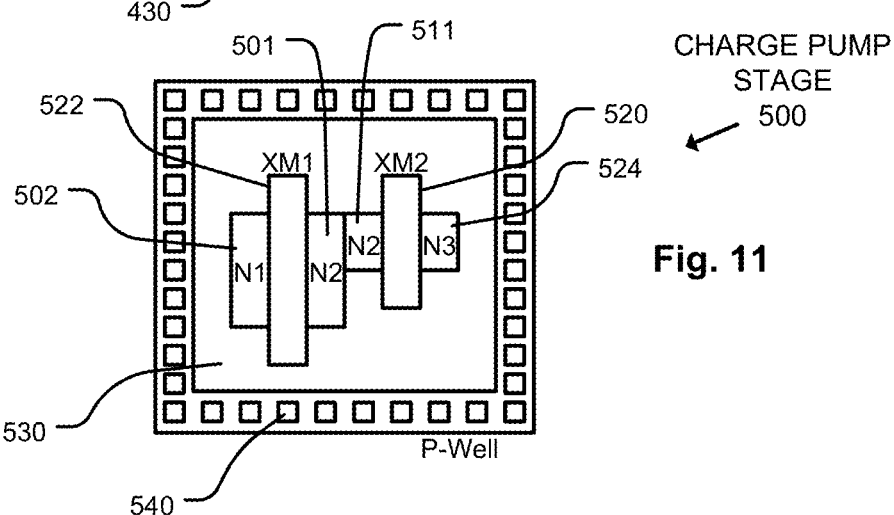
FIG. 11 is a simplified layout of a stage of a multi-stage charge pump as in FIG. 10, with a varying proximity of the charge pump nodes to the well-contacts at the periphery of the well.

FIG. 11 is a simplified layout of a stage of a multi-stage charge pump as in FIG. 10, with a varying proximity of the charge pump nodes to the well contacts at the periphery of a well region.

The stage of the multi-stage charge pump is surrounded by p-well contacts 540 for the p-well region 530. Transistor XM1 has gate 522 which selectively electrically couples node N1 502 and node N2 501 on opposite sides of gate 522. Transistor XM2 has a gate 520 which selectively electrically couples node N2 511 and node N3 524 on opposite sides of gate 520. The distance from node N2 501 to one nearest well contact, averaged over the perimeter of node N2 501, is longer than the distance from node N1 502 to another nearest well contact, averaged over the perimeter of node N1 502. The distance from node N2 511 to one nearest well contact, averaged over the perimeter of node N2 511, is longer than the distance from node N3 524 to another nearest well contact, averaged over the perimeter of node N3 524. A nearest well contact is a well contact that is nearest to a respective node, on average, averaged over the perimeter of the respective node.

Figure 12:
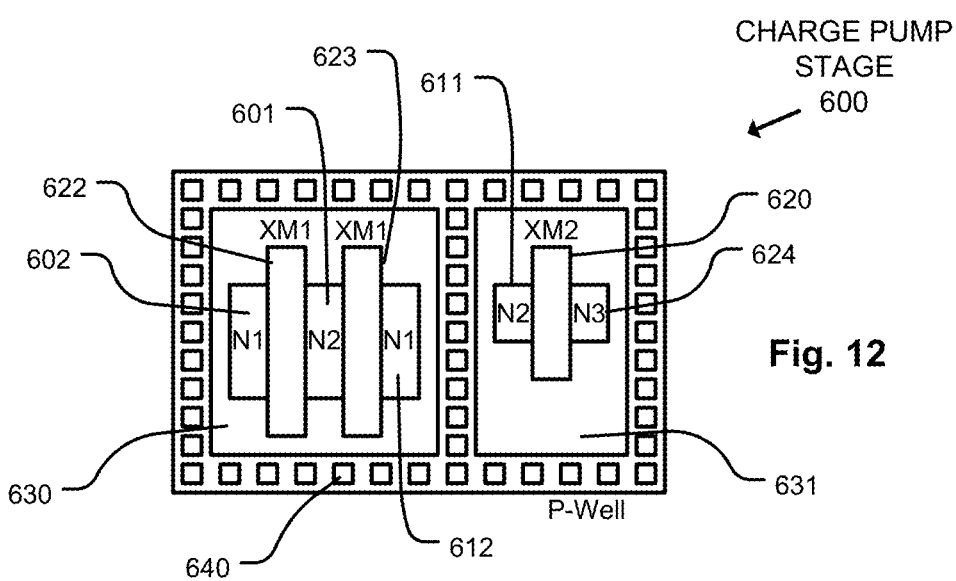
FIG. 12 is an alternative to the simplified layout of a stage of a multi-stage charge pump of FIG. 11.

FIG. 12 is an alternative to the simplified layout of a stage of a multi-stage charge pump of FIG. 11.

Transistor XM1 has a first gate 622 which selectively electrically couples node N1 602 and node N2 601 on opposite sides of first gate 622. Transistor XM1 has a second gate 623 which selectively electrically couples node N1 612 and node N2 601 on opposite sides of second gate 623. The input node N2 601 is between output node N1 602 and output node N1 612.

Transistor XM2 has a gate 620 which selectively electrically couples node N2 611 and node N3 624 on opposite sides of gate 620.

The stage of the multi-stage charge pump is surrounded by p-well contacts 640 for the p-wells 630 and 631. Transistors XM1 and XM2 are each surrounded by well contacts 640, such that some of well contacts 640 are in between transistors XM1 and XM2

Figure 13:
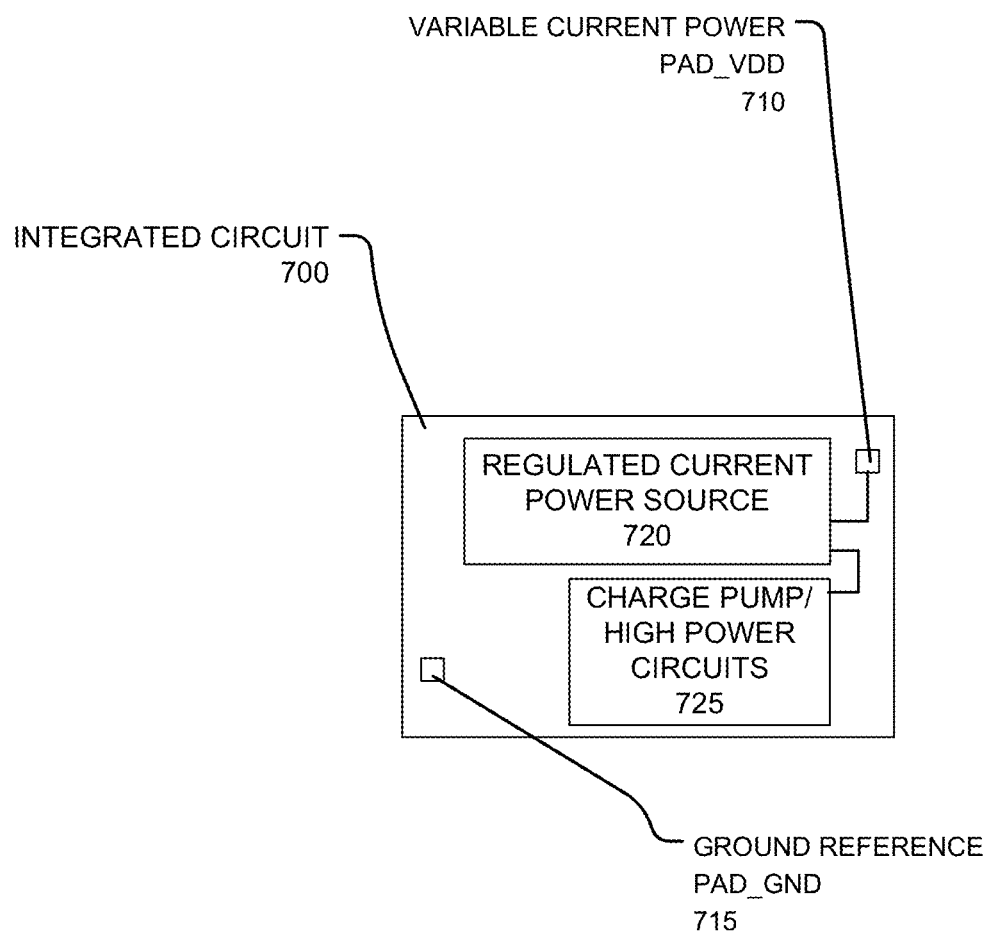
FIG. 13 is a simplified block diagram of an integrated circuit that receives external power with variable current, and internally generates regulated current power for high power circuits, with varying proximity of the circuitry to the pads.

FIG. 13 is a simplified block diagram of an integrated circuit that receives external power with variable current, and internally generates regulated current power for high power circuits, with proximity of the circuitry to the pads that depends on the particular pads.

Integrated circuit 700 includes regulated current power source 720 and high current/high power circuits 725 such as a charge pump. The regulated current power source 720 draws power from variable current power pad VDD 710, and is coupled also to ground reference pad GND 715. Variable current power pad VDD 710 and ground reference pad GND 715 are in turn coupled to respective pins of the IC package. The regulated current power source 720 is closer to the variable current power pad VDD 710 than to the ground reference pad GND 715. High current/high power circuits 725 also are closer to the variable current power pad VDD 710 than to the ground reference pad GND 715.

Figure 14:
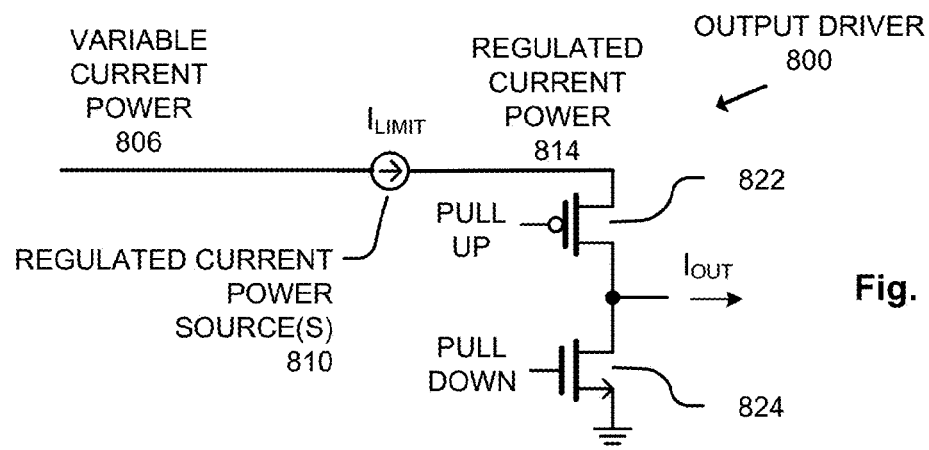
FIG. 14 is a simplified circuit diagram of an output driver as an example of a high power circuit in the integrated circuit of FIG. 1, 2, or 3.

FIG. 14 is a simplified circuit diagram of an output driver 800 as an example of a high power circuit in the integrated circuit of FIG. 1, 2, or 3.

Variable current power 806 is received by regulated current power source 810. Regulated current power source 810 in turn generates regulated current power 814. Pull up p-type transistor 822 and pull down n-type transistor 824 are coupled in series between regulated current power source 810 and a reference voltage such as ground. A node in series between pull up p-type transistor 822 and pull down n-type transistor 824 is the output of output driver 800.

Figure 15:
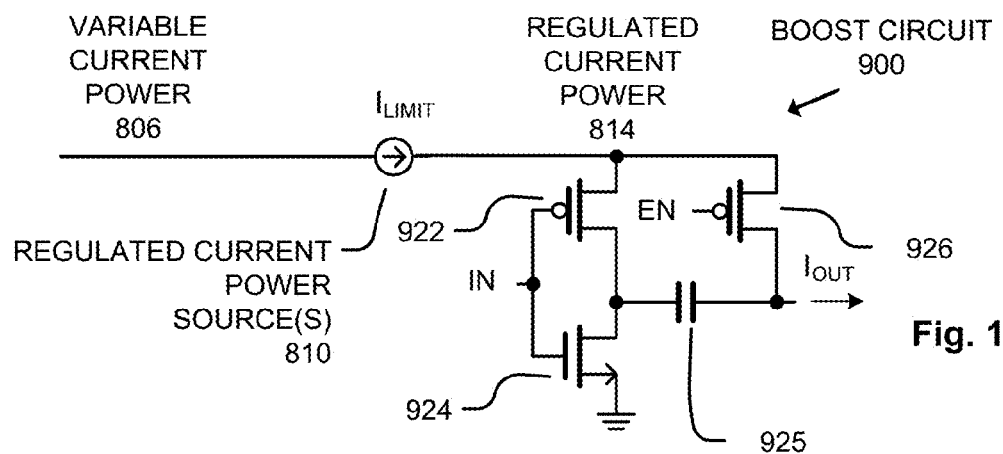
FIG. 15 is a simplified circuit diagram of a boost circuit as an example of a high power circuit in the integrated circuit of FIG. 1, 2, or 3.

FIG. 15 is a simplified circuit diagram of a boost circuit 900 as an example of a high power circuit in the integrated circuit of FIG. 1, 2, or 3.

Variable current power 806 is received by regulated current power source 810. Regulated current power source 810 in turn generates regulated current power 814. An inverter including p-type transistor 922 and n-type transistor 924 is coupled between regulated current power source 810 and a reference voltage such as ground. A boost capacitor 925 is coupled between the output of the inverter and the output of the boost circuit 900. An enable circuit includes a p-type transistor 926 coupled between regulated current power source 810 and the output of the boost circuit 900. P-type transistor 926 receives signal EN that selectively enables the boost circuit 900.

Other high power circuits that draw on regulated current include transistors of larger size relative to other transistors on the integrated circuit.

Figure 16:
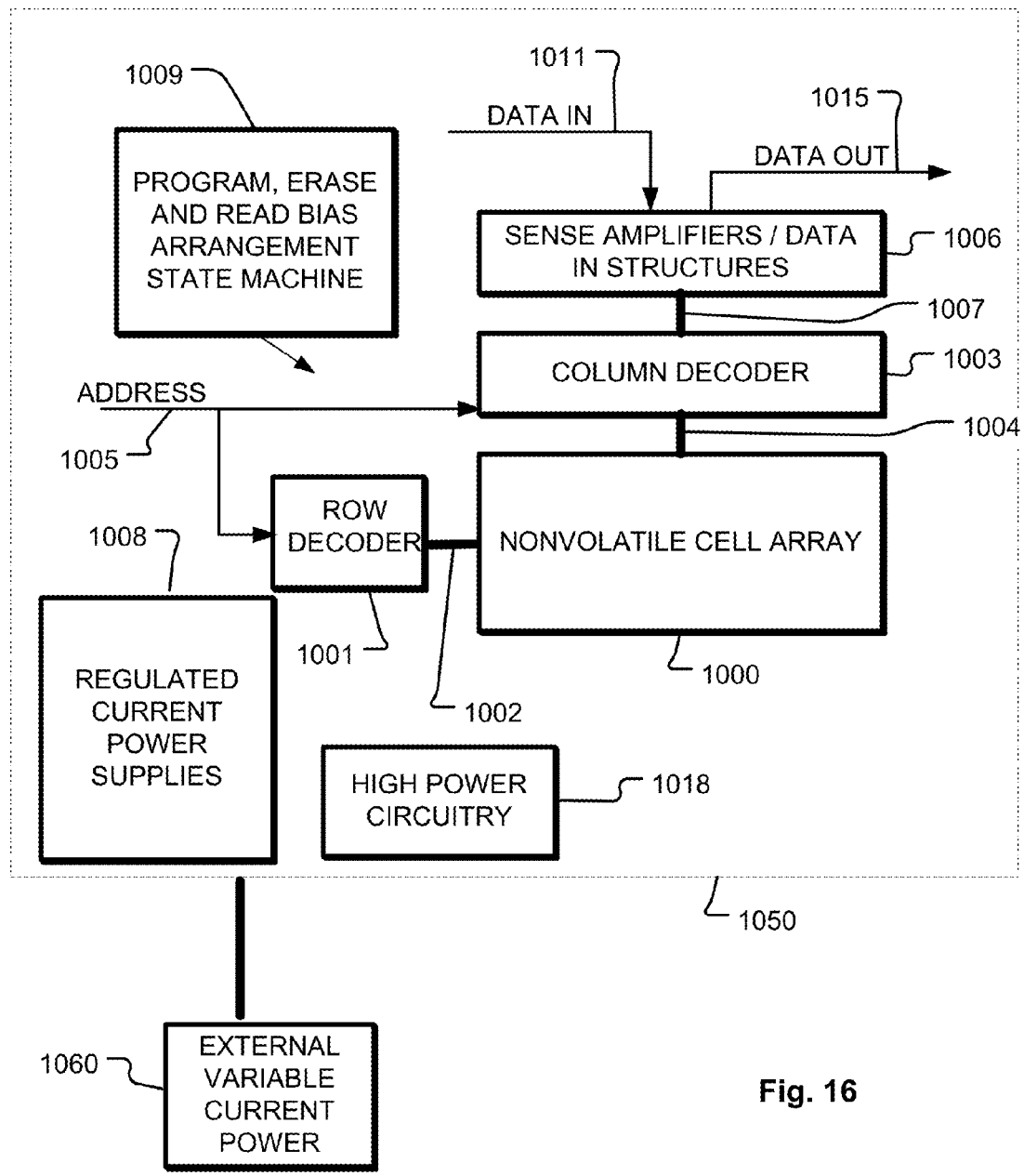
FIG. 16 is a block diagram of an integrated circuit that receives external power with variable current, and internally generates regulated current power for high power circuits.

FIG. 16 is a block diagram of an integrated circuit that receives external power with variable current, and internally generates regulated current power for high power circuits.

An integrated circuit 1050 includes a memory array 1000 such as a nonvolatile cell array. A word line decoder 1001 is coupled to and in electrical communication with a plurality of word lines 1002 arranged along rows in the memory array 1000. A bit line (column) decoder 1003 is in electrical communication with a plurality of bit lines 1004 arranged along columns in the array 1000. Addresses are supplied on bus 1005 to the word line decoder 1001 and bit line decoder 1003. Sense circuitry (sense amplifiers) and data-in structures in block 1006, including voltage and/or current sources are coupled to bit line decoder 1003 via data bus 1007. Data is supplied via a data-in line 1011 from input/output ports on integrated circuit 1050, or from other data sources internal or external to integrated circuit 1050, to data-in structures in block 1006. Other circuitry may be included on integrated circuit 1050, such as a general purpose processor or special purpose application circuitry, or a combination of modules providing system-on-a-chip functionality supported by array 1000. Data is supplied via a data-out line 1015 from the sense amplifiers in block 1006 to input/output ports on integrated circuit 1050, or to other data destinations internal or external to integrated circuit 1050.

A controller 1009 implemented in this example, using a bias arrangement state machine, controls the application of regulated current supply voltages 1008 to high power circuits 1018 such as charge pump circuitry, output drivers, and boost circuits. Controller 1009 may be responsive to power source memory settings to determine whether particular ones or parts of the high power circuits 1018 draw power from the regulated current power supplies 1008. The controller 1009 also controls application of bias arrangements including read, program, erase, erase verify and program verify voltages and/or currents for the word lines and bit lines. Controller 1009 may be implemented using special-purpose logic circuitry as known in the art. In alternative embodiments, controller 1009 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 1009.

External variable current power 1060 provides external power to the integrated circuit 1050.

An improved charge pump design is disclosed. This charge pump comprises at least one pumping transistor having a triple well arrangement. This triple pump transistor has a source and a drain region of a first conductive type formed on a first well having an opposite conductive type. A second well having the first conductive type is formed outside of the first well. The source region, first well and second well are set to substantially the same potential. One aspect of this configuration is that the first well forms a semiconductor diode with the drain region. Another aspect of this arrangement is that the body effect of the transistor is reduced. The reduction in body effect reduces the threshold voltage of the transistor. It is found that the above mentioned diode and threshold voltage reduction, singly and in combination, allow the charge pump to operate more efficiently.

A charge pump is a circuit that can generate an output voltage that is higher than the voltage supplied to the charge pump. One of the applications of charge pumps is to develop voltage for erasing and programming some kinds of nonvolatile semiconductor memory devices, such as electrical erasable programmable read only memory (EEPROM) and flash memory. One way to operate these memory devices is to program through hot electron injection and erase through Fowler-Nordheim tunneling. The programming and erasing of such a memory cell require current to pass through the dielectric surrounding a floating gate electrode. As a result, a high voltage is generally needed. Some prior art nonvolatile semiconductor memory devices require the application of an external high voltage (e.g, 12 volts) in addition to a regular 5 volts supply voltage. This arrangement is undesirable because it is complicated and wastes real estate on circuit boards. Recently, many nonvolatile semiconductor memory device manufacturers place charge pumps on chip so as to develop the required high voltage for erasing and programming. Many customers welcome this development, and the sale of nonvolatile semiconductor devices increases.

As the number of memory cells in a nonvolatile semiconductor memory device increases, the current required to erase and program these cells also increases. As a result, there is a need for the charge pump to be efficient, e.g., generating more current and at a faster rate.

The present technology relates to using triple well transistors to increase the efficiency of a charge pump. The inventive charge pump comprises a plurality of pumping transistors arranged to increase the voltage level, or push the voltage lend to a negation valve, from a first pumping transistor to a last pumping transistor in response to clock pulses applied to these pumping transistors. At least one of the plurality of pumping transistors has a source and a drain region of a first conductivity type formed on a first well having an opposite conductivity type.

A second well having the first conductivity type can be formed outside of the first well. The second well is fabricated on a substrate. This transistor design is commonly referred to as a "triple well" transistor. The source region, first well and the second well are preferably set to substantially the same potential. In one embodiment, the second well can be set to the highest positive potential of the charge pump.

One aspect of this configuration is that the first well forms a semiconductor diode with the drain region. This diode allows more current to flow through the pumping transistor, when compared with a pumping transistor of conventional construction. Another aspect of this arrangement is that it reduces the body effect of the triple well transistor. As a result, the threshold voltage of the transistor is reduced. The reduction in threshold voltage allows the transistor to be turned on faster.

It is found that the above mentioned diode and threshold voltage reduction effects, singly and in combination, allow the charge pump to operate more efficiently. Examples of the improved efficiency include increasing the output current, lowering the power supply voltage level, and increasing the operating frequency.

The triple well pumping transistor can be used in positive voltage and negative voltage charge pumps.

The present technology related is to a novel charge pump system.

Figure 17:
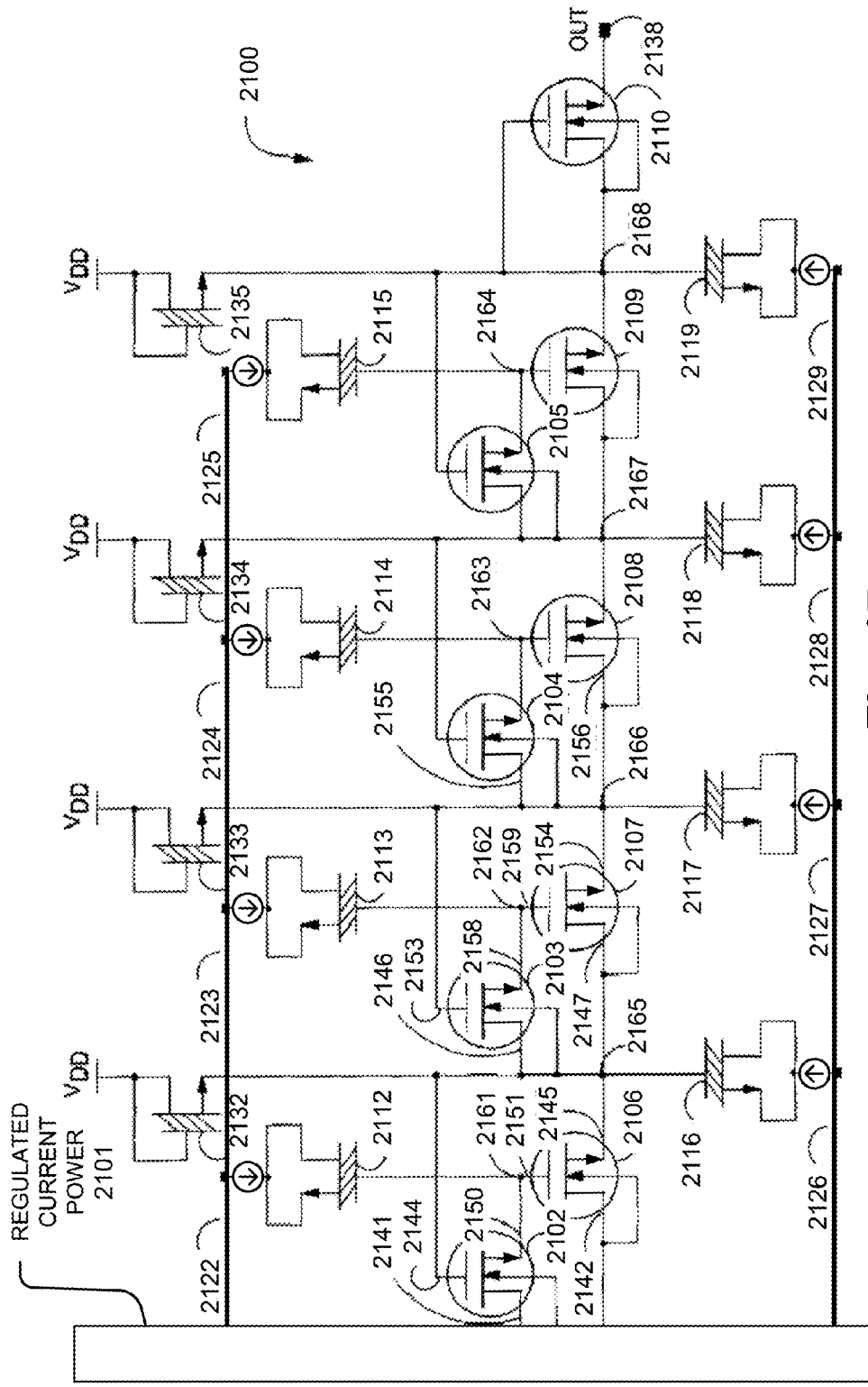
FIG. 17 is a schematic diagram of a four-stage charge pump.
Figure 18:
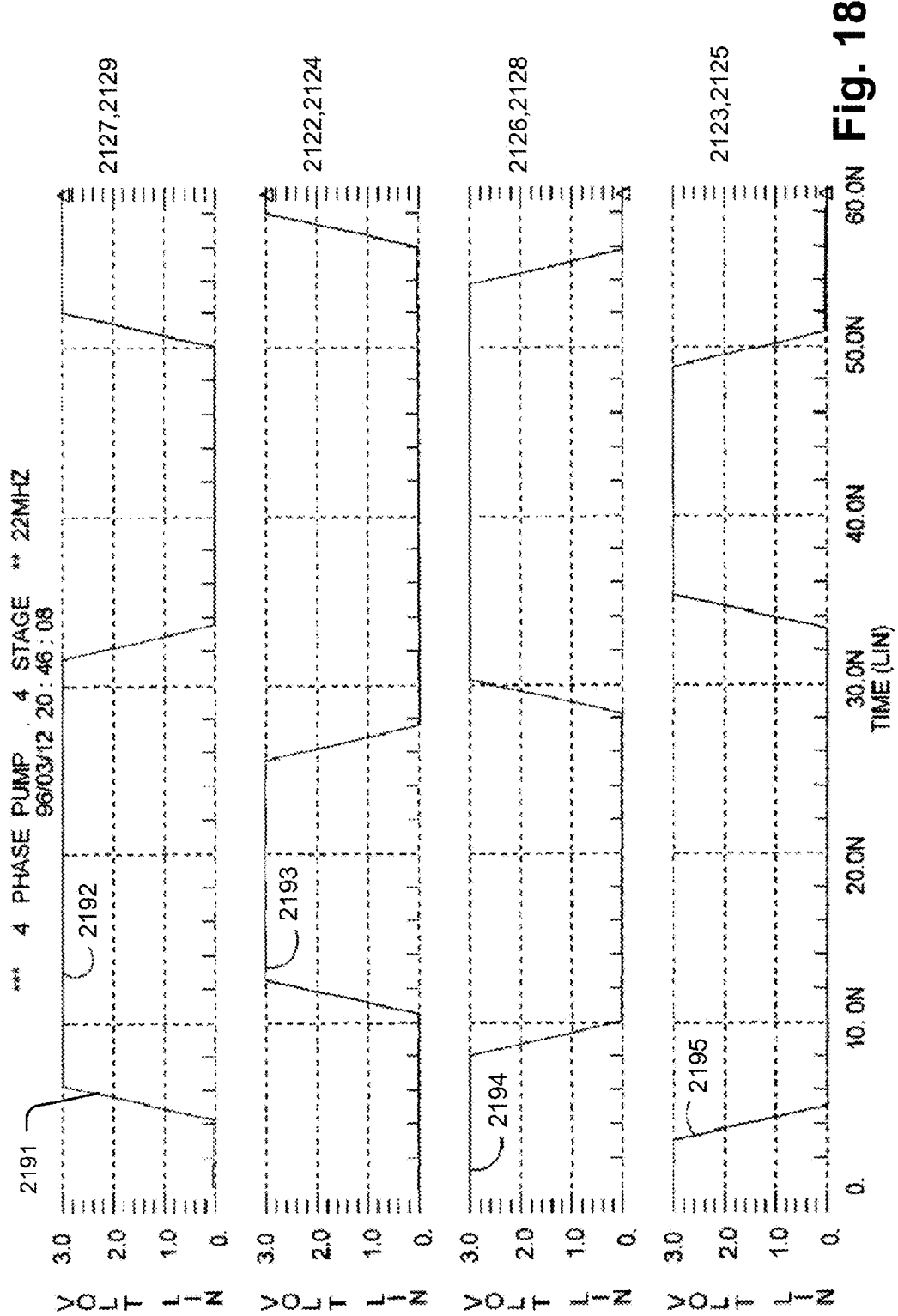
FIG. 18 shows timing diagram of clock signals pulses that can be used with the charge pump of FIG. 17.

FIG. 17 is a schematic diagram of a four-stage charge pump 2100. Charge pump 2100 comprises nine triple well NMOS transistors 2102-2110 and twelve normal NMOS transistors 2112-2119 and 2132-2135. These normal NMOS transistors are preferably native n-channel devices that have a low threshold voltage. Normal NMOS transistors 2132-2135 function as pull up transistors. Normal NMOS transistors 2112-2119 function as capacitors, and are coupled to clock signals 2122-2129. Regulated current power 2101 has output clock signal buses that generate the clock signals 2122-2129. The clock signals are coupled to the corresponding triple well NMOS transistors via the capacitive action of transistors 2112-2119. Although there are eight clock signals, they are arranged in pairs: (2122,2124), (2123,2125), (2126,2128), and (2127,2129). Each clock signal in a pair has the same signal timing while different pairs have different signal timings. The clock signals are shown in FIG. 18 where timings 2192-2195 correspond to pairs (2127,2129), (2122,2125), (2126, 2128) and (2123, 2125), respectively. The clock signals have a voltage-vs-time slope (such as 2191) that is determined by the regulated current generated by the on-chip power supply. These signals alternatively boost up the gates of these capacitors. This results in an increase in voltage level from stage to stage. The way voltage is being pumped up is similar to a conventional charge pump. In one embodiment, the output voltage at the source terminal of triple well NMOS 2110 is approximately 10.5 volts while the voltage supplied to charge pump 2100 is only 3 volts. As explained in detail below, the use of these triple well transistors (instead of normal NMOS transistors) enhances the performance and efficiency of charge pump 2100 compared to prior art four-stage charge pumps.

It should be noted that a charge pump preferably includes other associated circuits, e.g., precharge and voltage regulation circuits. These circuits are well known by persons of ordinary skill in the art, and will not be described here.

Figure 19:
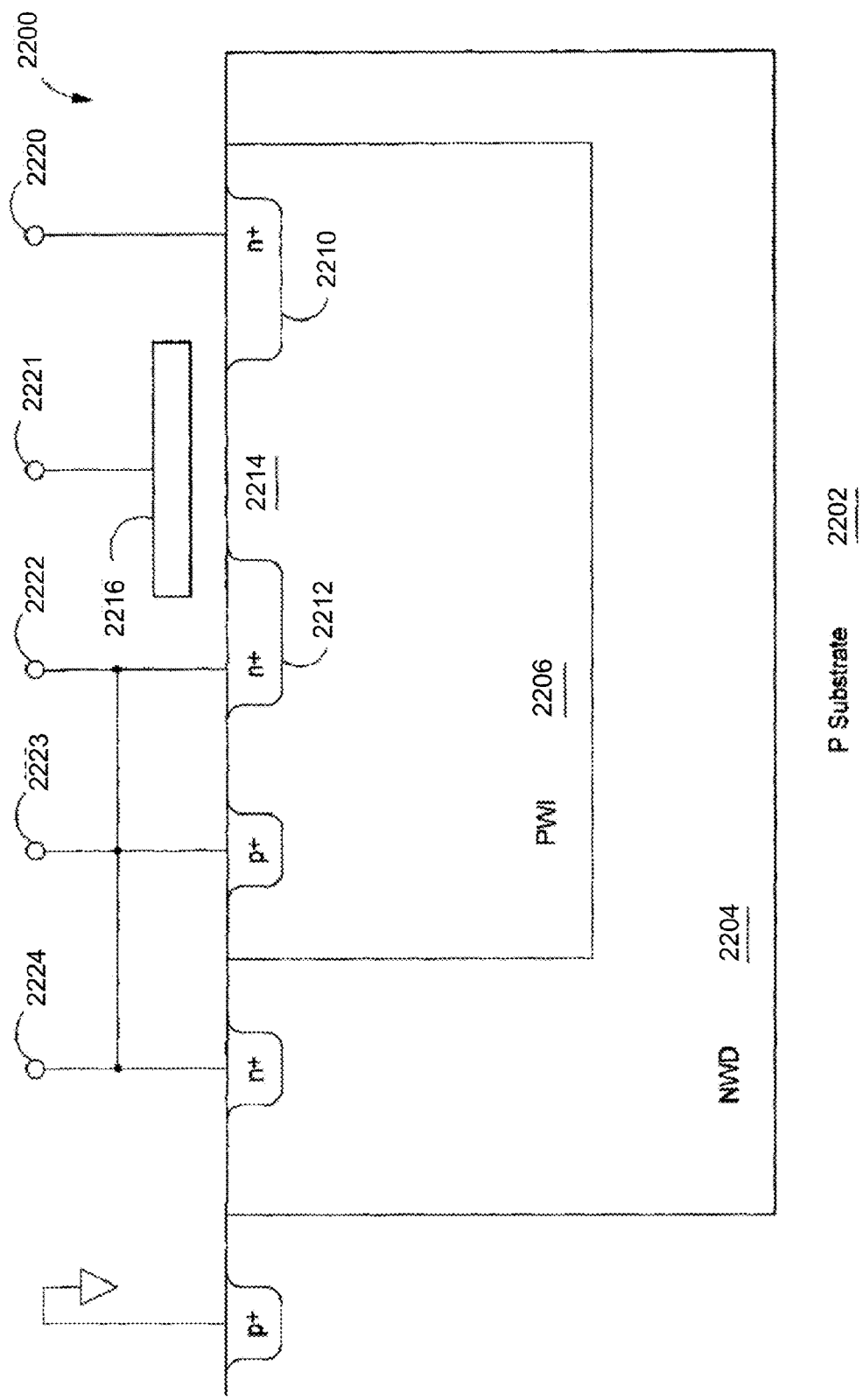
FIG. 19 shows, schematically, a cross sectional view of a triple well NMOS transistor.

FIG. 19 shows, schematically, a cross sectional view of a triple well NMOS transistor 2200 that can be used for transistors 2102-2110 of FIG. 17. Transistor 2200 is fabricated on a p-type substrate 2202. An N well 2204 is formed in substrate 2202, and a P well 2206 is formed in N well 2204. An N+ type drain region 2210 is formed in P well 2206, as is an N+ source region 2212. A channel region 2214 is defined between source and drain regions in P well 2206. A polysilicon gate 2216 is positioned above channel region 2214. A thin gate oxide is deposited between gate 2216 and channel region 2214. Drain region 2210, gate 2216, source region 2212, P well 2206, and N well 2204 are coupled to individual terminals 2220-2224, respectively. Thus, triple well transistor 2200 can be considered a five-terminal device. In one embodiment, the N+ source and N+ drain are interchangeable when the charge pump is activated because either terminal may have higher potential than the other.

In one embodiment, the potential of source region 2212, P well 2206 and N well 2204 are set to the same value. One way to meet this condition is to electrically connecting terminals 2222, 2223 and 2224. The potential of substrate 2202 is normally set to ground. This arrangement creates a PN diode between P well 2206 and drain region 2210. The diode is inherent in this triple well construction, and does not occupy any extra silicon area. This diode is able to conduct significant amount of current after it is turned on, and thus adds an extra low resistance path to the NMOS transistor. In this application, this diode is called an "extra diode." As explained in more detail below, this extra diode has the following advantageous effects:

(1) The size of the pass gate of the triple well NMOS transistors 2102-2109 can be reduced because some of the current for charging the next stage NMOS capacitors (i.e., transistors 2112-2119) can be conducted by the extra diode.

(2) Because the size of the NMOS transistors 2102-2109 can be reduced, their parasitic capacitance is reduced. As a result, less power is consumed and the pump output current can be increased.

(3) This low resistance extra diode path increases the forward conduction current. It can increase the pumping frequency because charges can be built up faster.

(4) The extra diode conduction path reduces the peak voltage swing at the output transistor 110 from VDD+Vout to 0.7+Vout volts, where VDD is the power supply voltage and Vout is the output voltage at an output terminal 2138 of charge pump 2100. As a result, the internal voltage stress of the charge pump is reduced.

As a result of the above mentioned advantages, the performance of charge pump 2100 improves tremendously by the presence of this diode. This benefit is achieved without requiring any silicon real estate.

Another advantage of this arrangement is that the body effect is suppressed. Body effect arises when the source and substrate junction is reverse biased. It is well known that the threshold voltage of a NMOS transistor is given by: ##EQU1## where VT0 is the threshold voltage when there is no substrate bias, VBS is the potential between the source and the body, and VBI is the voltage difference of a P-N junction if no external voltage is applied (i.e., zero bias). The typical values for VT0, VBI and γ are 0.7 volt, 0.7 volt, and 0.4, respectively.

It can be seen from the above equation that applying a voltage across a reverse-biased source-substrate junction tends to increase the threshold voltage of a transistor. In the triple well transistor, VBS is limited within the P-N junction cut-in voltage of 0.7 volt. This is because when pumping is activated, charge flows from N+ diffusion region 2212 to N+ diffusion region 2210 through channel 2214 and the extra diode created by well 2206 and region 2210. Thus, the lower potential N+ diffusion region 2210, which is the source, suffers minimized substrate bias around 0.7 volt which is much less as compared to more than 10 volts of substrate bias in prior art regulator NMOS charge pumps. In a charge pump circuit, it is important to generate high forward conduction current so that charges can be build up quickly. A low threshold voltage allows the NMOS channels to be turned on faster, and thus can increase the pumping frequency. Because the threshold voltage of the triple well NMOS transistor is very low, the pumping frequency of the present inventive charge pump can be much higher than prior art charge pumps. In an embodiment, the charge pump can operate efficiently at 22 MHz while prior art charge pump typically operates at 10 MHz.

Figure 20:
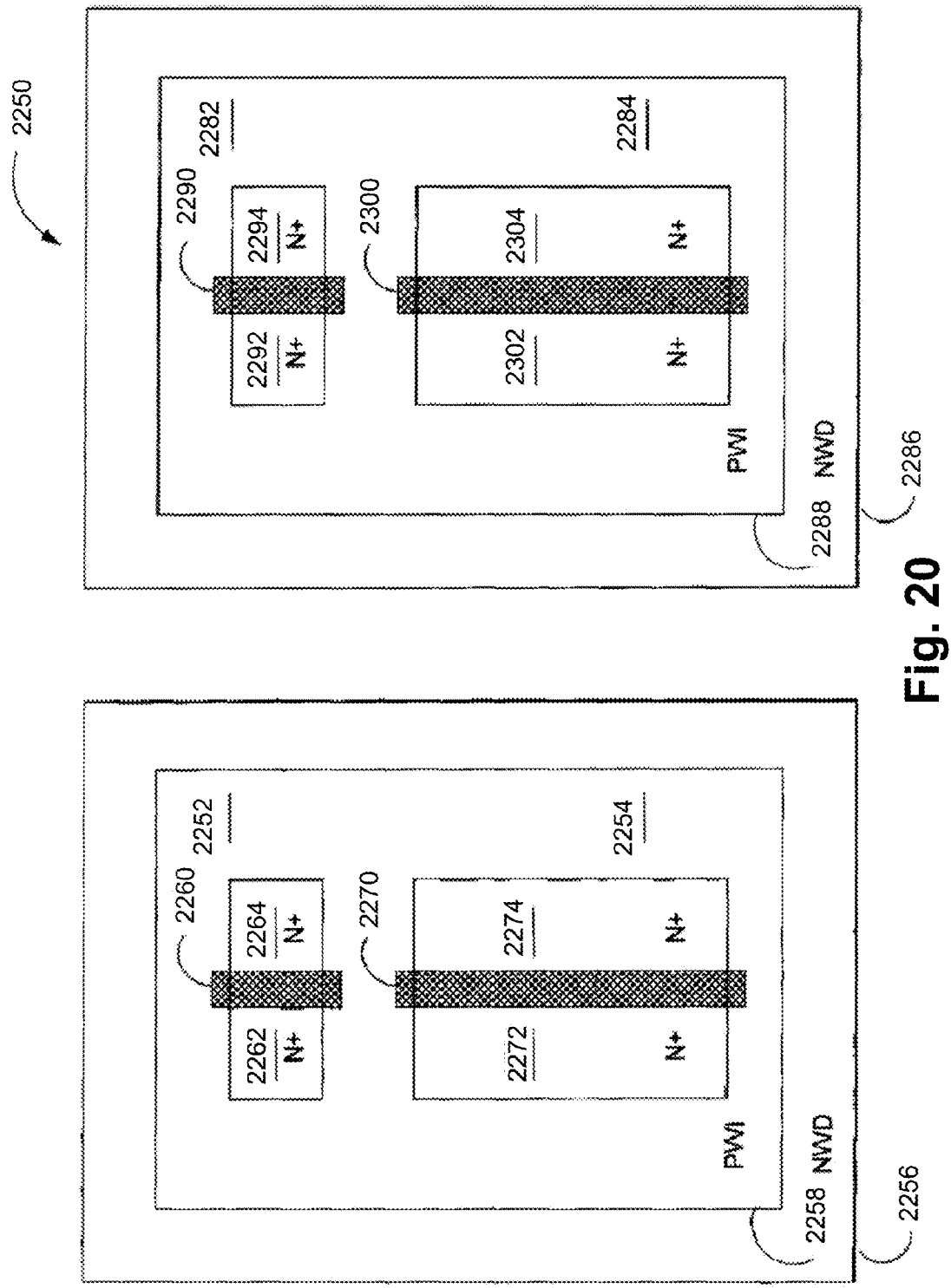
FIG. 20 is the top view of four triple well transistors that can be used in the charge pump of FIG. 17.

FIG. 20 shows a top view 2250 of four triple well transistors. It shows two transistors 2252 and 2254 formed inside a P well 2258 and an N well 2256. Transistor 2252 further comprises a gate 2260, a source region 2262 and a drain region 2264. Transistor 2252 could correspond to transistor 2102 of FIG. 17. Transistor 2254 further comprises a gate 2270, a source region 2272 and a drain region 2274. Transistor 2254 could correspond to transistor 2106 of FIG. 17.

FIG. 20 also shows two transistors 2282 and 2284 formed inside a P well 2288 and an N well 2286. Transistor 2282 further comprises a gate 2290, a source region 2292 and a drain region 2294. Transistor 2282 could correspond to transistor 2103 of FIG. 17. Transistor 2284 further comprises a gate 2280, a source region 2282 and a drain region 2284. Transistor 2284 could correspond to transistor 2107 of FIG. 17.

Referring to both FIGS. 17 and 20, the source terminal 2141 of transistor 2102 and source terminal 2142 of transistor 2106 are connected to VDD. Thus, source regions 2262 and 2272 of transistors 2252 and 2254, respectively, have the same potential (i.e., VDD. As explained above, P well 2258 and N well 2256 should have the same potential as source regions 2262 and 2272. Thus these two wells also have the same potential (VDD).

FIG. 17 shows that the gate terminal 2144 of transistor 2102 is connected to the drain terminal 2145 of transistor 2106, the source terminal 2146 of transistor 2103 and the source terminal 2147 of transistor 2107. As explained above, P well 2288 and N well 2286 should have the same potential as source regions 2292 and 2302 (which are coupled to source terminals 2146 and 2147). Thus in FIG. 20, gate 2260, drain region 2274, source regions 2292 and 2302, N well 2286 and P well 2288 all have the same potential.

FIG. 17 shows that the drain terminal 2150 of transistor 2102 is connected to the gate 2151 of transistor 2106. Thus, in FIG. 20, drain region 2264 has the same potential as gate 2270.

FIG. 17 shows that the gate terminal 2153 of transistor 2103 is connected to the drain terminal 2154 of transistor 2107 (in addition to the source terminals 2155 and 2156 of transistors 2104 and 2108). Thus in FIG. 20, gate 2290 has the same potential as drain region 2304. FIG. 17 also shows that the drain terminal 2158 of transistor 2103 is connected to the gate 2159 of transistor 2107. Thus, in FIG. 20, drain region 2294 has the same potential as gate 2300.

In FIG. 20, only four of the nine triple well NMOS transistors comprising a charge pump are shown. The structure of transistors 2104-2105 and 2108-2109 is similar to that shown in FIG. 20. The structure of transistor 2110 is similar to that of transistor 2254 of FIG. 20.

In one embodiment, the channel lengths of all the triple well transistors are 1.2 μm. The channel widths of transistors 2252 and 2282 (corresponding to transistors 2102 and 2103 of FIG. 17) are 6 μm while the channel widths of transistors 2254 and 2284 (corresponding to transistors 2106 and 2107 of FIG. 17) are 18 μm. Transistors 2104 and 2105 have the same structure as transistors 2102 and 2103, respectively. Thus, these two transistors also have a channel length of 1.2 μm and a channel width of 6 μm. Transistors 2108 and 2109 have the same structure as transistors 2106 and 2107, respectively. Thus, these two transistors also have a channel length of 1.2 μm and a channel width of 18 μm. For the output transistor 2110 of FIG. 17, the channel width is 15 μm.

The dimension of normal transistors 2112-2119 and 2132-2135 of the same embodiment is shown in Table 1.

TABLE 1

| Transistor | Channel Length (μm) | Channel Width (μm) |
|---|---|---|
| 2112 | 10 | 18 |
| 2113 | 10 | 18 |
| 2114 | 20 | 18 |
| 2115 | 20 | 24 |
| 2116 | 120 | 60 |
| 2117 | 120 | 60 |
| 2118 | 120 | 60 |
| 2119 | 120 | 60 |
| 2132 | 1.2 | 4 |
| 2133 | 1.2 | 4 |
| 2134 | 1.2 | 4 |
| 2135 | 1.2 | 4 |

I determine the improvement of the triple well transistors over normal transistors in a charge pump, four tables showing the pump load lines are presented below. In each table, the two right hand columns correspond to the load line of a charge pump constructed using the preferred triple well transistor. The two columns to the left of these two right hand columns correspond to the load line of the same charge pump constructed using normal transistors. It is observed that the inventive charge pump has a higher current at almost all voltage levels.

TABLE 2

| pump load line, VDD = 2 v, temp = 25 C. Iout measure by root-mean-square, unit in mA | | | | |
|---|---|---|---|---|
| Vout/Iout | Prior Art-4-Phase 7.3 MHz | Prior Art-4-Phase 22 MHz | Prior Art-4-Phase 7.3 MHz | Prior Art-4-Phase 22 MHz |
| 10 v | 0.0 | 0.0 | 0.0 | 0.0 |
| 9 v | 0.0 | 0.0 | 0.01 | 0.02 |
| 8 v | 0.01 | 0.01 | 0.04 | 0.1 |
| 7 v | 0.04 | 0.05 | 0.09 | 0.24 |
| 6 v | 0.08 | 0.12 | 0.19 | 0.48 |
| 5 v | 0.34 | 0.19 | 0.27 | 0.75 |

TABLE 3 pump load line, VDD = 2 v, temp = 25 C.
Iout measure by average, unit in mA

| Vout/Iout | Prior Art-4-Phase 7.3 MHz | Prior Art-4-Phase 22 MHz | Prior Art-4-Phase 7.3 MHz | Prior Art-4-Phase 22 MHz |
|---|---|---|---|---|
| 10 v | 0.0 | 0.0 | 0.0 | 0.0 |
| 9 v | 0.0 | 0.0 | 0.01 | 0.02 |
| 8 v | 0.01 | 0.01 | 0.03 | 0.9 |
| 7 v | 0.04 | 0.05 | 0.06 | 0.17 |
| 6 v | 0.06 | 0.11 | 0.08 | 0.25 |
| 5 v | 0.09 | 0.166 | 0.10 | 0.31 |

TABLE 4 pump load line, VDD = 3 v, temp = 25 C.
Iout measure by Root-mean-square, unit in mA

| Vout/Iout | Prior Art-4-Phase 7.3 MHz | Prior Art-4-Phase 22 MHz | Prior Art-4-Phase 7.3 MHz | Prior Art-4-Phase 22 MHz |
|---|---|---|---|---|
| 10 v | 0.11 | 0.266 | 0.29 | 0.75 |
| 9 v | 0.176 | 0.396 | 0.05 | 1.39 |
| 8 v | 0.256 | 0.548 | 0.75 | 1.6 |
| 7 v | 0.341 | 0.712 | 0.92 | 1.75 |
| 6 v | 0.419 | 0.799 | 1.25 | 1.8 |
| 5 v | 0.47 | 0.952 | 1.35 | 1.98 |

TABLE 5 pump load line, VDD = 3 v, temp = 25 C.
Iout measure by average, unit in mA

| Vout/Iout | Prior Art-4-Phase 7.3 MHz | Prior Art-4-Phase 22 MHz | Prior Art-4-Phase 7.3 MHz | Prior Art-4-Phase 22 MHz |
|---|---|---|---|---|
| 10 v | 0.078 | 0.217 | 0.107 | 0.302 |
| 9 v | 0.108 | 0.300 | 0.128 | 0.423 |
| 8 v | 0.137 | 0.386 | 0.157 | 0.400 |
| 7 v | 0.167 | 0.468 | 0.178 | 0.496 |
| 6 v | 0.190 | 0.520 | 0.205 | 0.504 |
| 5 v | 0.203 | 0.597 | 0.222 | 0.532 |

The result shown in Tables 2-5 shows the following:

(1) The charge pump functions efficiently at low VDD voltage. For example, the performance improvement of the inventive charge pump over prior art charge pumps at VDD=2 volts is greater than that at VDD=3 volts. It is found that the inventive charge pump can operate effectively down to 1.5 volt.

(2) The charge pump can operate efficiently at 22 MHz. For example, Table 2 shows that the output current for the inventive charge pump at 22 MHz is about 2.5 times that at 7.3 MHz (Vout=7 v). On the other hand, there is little difference in the output current of a prior art charge pump at 22 MHz and 7.3 MHz.

Figure 21A:
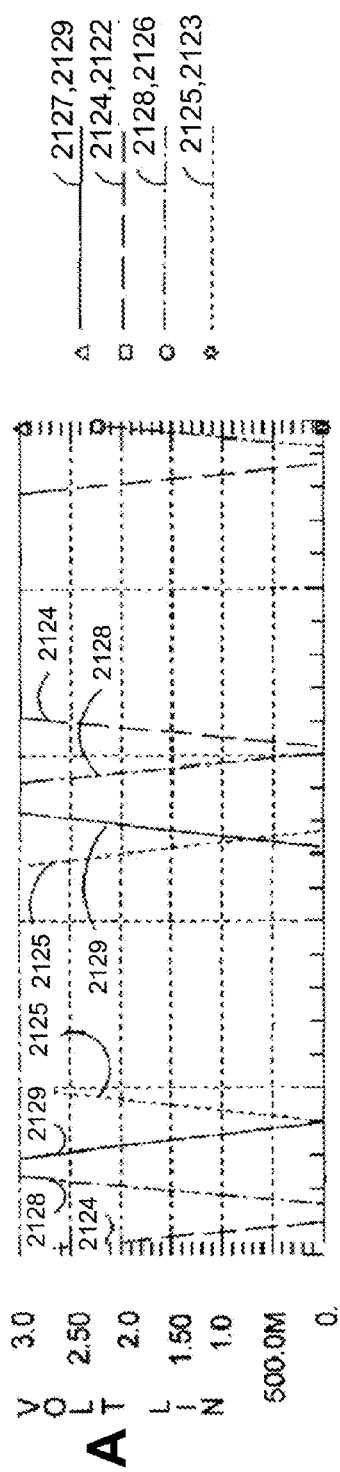
FIGS. 21A-21C show voltage profiles at various points of the charge pump of FIG. 17.
Figure 21B:
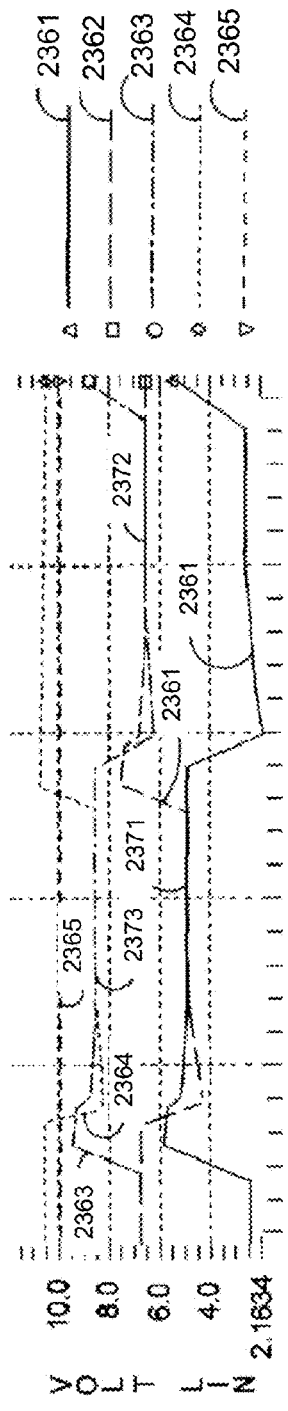
Figure 21C:
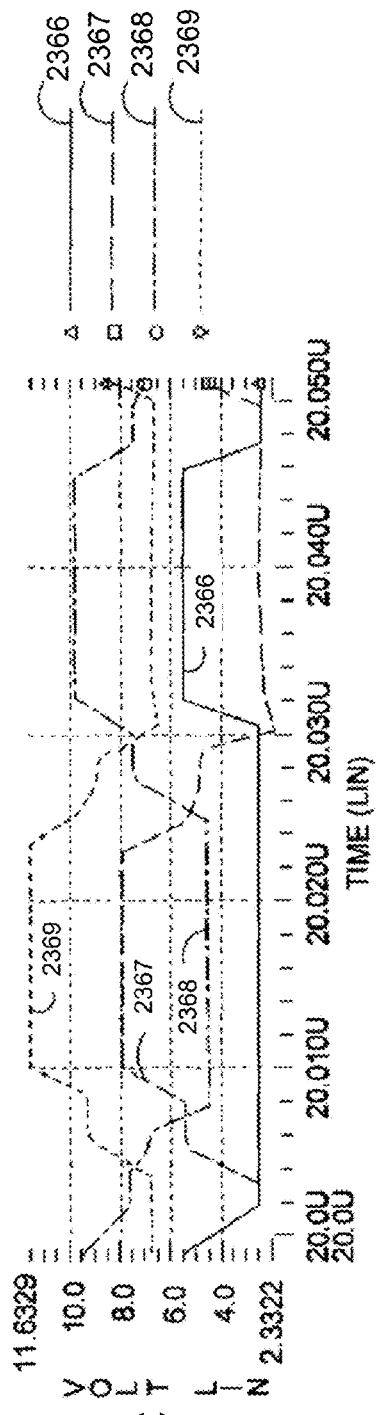

The operation of charge pump 2100 is now explained. FIGS. 21A-21C show voltage profiles at nodes 2161-2168 and 2138 of FIG. 17. FIG. 21A shows four clock signals which are the same as signals 2124, 2125, 2128 and 2129 of FIG. 18. These clock signals are shown here again so as to provide a reference to understand the voltage profiles. FIG. 21B shows the voltage profiles 2361-2365 at nodes 2165-2168 and 2138, respectively. FIG. 21C shows the voltage profiles 2366-2369 at nodes 2161-2164, respectively. It can be seen at regions 2371-2373 of FIG. 21B that charges are being pumped to subsequent stages when the triple well transistors 2107-2109 are turned on. As a result, the voltages of the two adjoining stages are equal at these regions. This pumping effect is enhanced by the extra diode and reduced threshold voltage of the corresponding triple well transistor. The improved effect of other triple well transistors can be easily analyzed by person skilled in the art, and will be not explained in detail here.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit comprising:
a power supply input pin for receiving an off-chip supply voltage;
an on-chip power source to be powered by the off-chip supply voltage;
a set of one or more circuits;
a configuration memory storing a set of one or more memory settings that indicates whether each member of the set of one or more circuits is powered by the on-chip power source or by the off-chip supply voltage; and
control circuitry, responsive to the set of one or more memory settings, controlling whether each member of the set of one or more circuits is powered by the on-chip power source or by the off-chip supply voltage.

2. The integrated circuit of claim 1, wherein the set of one or more circuits includes a charge pump driven by a multi-phase clock signal, the multi-phase clock signal having a voltage-versus-time slope determined by a regulated current.

3. The integrated circuit of claim 1, wherein:
the set of one or more circuits includes components of a charge pump, the components of the charge pump including a plurality of serially coupled charge pump stages arranged to pump charge from a first stage to a last stage of the plurality; and
the charge pump stages of the plurality include an input node, an output node, a pass transistor electrically coupling the input node and the output node, a first boost capacitor coupled to the output node, and a second boost capacitor coupled to a gate of the pass transistor.

4. The integrated circuit of claim 1, wherein:
the set of one or more circuits includes components of a charge pump, the components of the charge pump including a plurality of serially coupled charge pump stages arranged to pump charge from a first stage to a last stage of the plurality;
a particular stage of the plurality of serially coupled charge pump stages includes:
a first transistor selectively electrically coupling an input node of the particular stage and an output node of the particular stage; and
a second transistor selectively electrically coupling the input node and a gate of the first transistor;
the particular stage is in a well surrounded by a plurality of well contacts; and
the input node is defined by a first region in the well, the output node is defined by a second region in the well, the first region and the second region are on opposite sides of the gate of the first transistor, the first region having a first distance from a nearest well contact of the plurality of well contacts averaged along a first perimeter of the first region, the second region having a second distance from another nearest well contact of the plurality of well contacts averaged along a second perimeter of the first region, the second distance shorter than the first distance.

5. The integrated circuit of claim 1, wherein:
the set of one or more circuits includes components of a charge pump, the components of the charge pump including a plurality of serially coupled charge pump stages arranged to pump charge from a first stage to a last stage of the plurality;
a particular stage of the plurality of serially coupled charge pump stages includes a first transistor selectively electrically coupling an input node of the particular stage and an output node of the particular stage, and a second transistor selectively electrically coupling the input node and a gate of the first transistor;
the particular stage is in a well surrounded by a plurality of well contacts; and
the input node is defined by a first region in the well, the output node is defined by a plurality of second regions in the well, and the first region is between the plurality of second regions.

6. The integrated circuit of claim 1, wherein:
the on-chip power source includes a plurality of parallel current sources; and
the integrated circuit includes an additional set of one or more memory settings that indicates whether a particular parallel current source of the plurality of parallel current sources provides current that is included in a regulated current.

7. The integrated circuit of claim 1, wherein:
the on-chip power source includes:
a reference current source; and
a plurality of transistors having at least two different widths;
at least a first transistor of the plurality of transistors is in series with the reference current source; and
wherein at least a second transistor of the plurality of transistors provides an output current determined by a ratio of the at least two different widths of at least the first and the second transistors of the plurality of transistors.

8. The integrated circuit of claim 7, wherein the on-chip power source includes an operational amplifier in a loop from a gate of at least the first transistor of the plurality of transistors to the reference current source.

9. The integrated circuit of claim 1, wherein the on-chip power source has a nominal output voltage that is independent of the off-chip supply voltage.

10. The integrated circuit of claim 1, wherein the set of one or more circuits includes a capacitive boosting circuit.

11. The integrated circuit of claim 1, wherein the set of one or more circuits includes an output driver.

12. The integrated circuit of claim 1, wherein the set of one or more circuits includes a clock circuit.

13. The integrated circuit of claim 1, further comprising:
a semiconductor body having a particular conductivity type;
a first well in the semiconductor body having the particular conductivity type;
a second well in the semiconductor body surrounding the first well and having an opposite conductivity type relative to the particular conductivity type;
a plurality of transistors arranged to pump a voltage level from a first transistor to a last transistor in response to one or more clock signals, the last transistor having a voltage level substantially higher than, or negative relative to, a power supply voltage coupled to the plurality of transistors; and
at least one of the plurality of transistors having a source and a drain region of the opposite conductivity type formed in the first well, the first well, the second well and the drain region being coupled to a common potential,
wherein the set of one or more circuits includes the plurality of transistors.

14. An integrated circuit comprising:
a power supply input pin for receiving an off-chip supply voltage;
an on-chip power source to be powered by the off-chip supply voltage;
a set of one or more circuits to be powered by at least one of the off-chip supply voltage and the on-chip power source;
a configuration memory storing a set of one or more memory settings that indicates whether at least one circuit of the set of one or more circuits is powered by the on-chip power source; and
control circuitry, responsive to the set of one or more memory settings, controlling whether the at least one circuit is powered by the on-chip power source, wherein:
the set of one or more circuits includes components of a charge pump, the components of the charge pump including a plurality of serially coupled charge pump stages arranged to pump charge from a first stage to a last stage of the plurality;
the charge pump stages of the plurality including an input node, an output node, a pass transistor electrically coupling the input node and the output node, a first boost capacitor coupled to the output node, and a second boost capacitor coupled to a gate of the pass transistor; and
the memory settings indicate whether at least one of: (i) the first boost capacitors, (ii) the second boost capacitors, and (iii) the input node of a first stage are powered by the on-chip power source.

15. A method comprising:
accessing, from an integrated circuit, a set of one or more memory settings that indicates whether each member of a set of one or more circuits is powered by an on-chip power source or by an off-chip supply voltage, the on-chip power source powered by the off-chip supply voltage via a power supply input pin; and
responsive to the set of one or more memory settings, controlling whether each member of the set of one or more circuits is powered by the on-chip power source or by the off-chip supply voltage.

16. The method of claim 15, wherein:
the memory settings indicate whether at least one of: (i) first boost capacitors, (ii) second boost capacitors, and (iii) an input node of a first stage are powered by the on-chip power source or by the off-chip supply voltage;
the set of one or more circuits includes components of a charge pump, the components of the charge pump including a plurality of serially coupled charge pump stages arranged to pump charge from the first stage to a last stage of the plurality; and
the charge pump stages of the plurality include the input node, an output node, a pass transistor electrically coupling the input node and the output node, the first boost capacitor coupled to the output node, and the second boost capacitor coupled to a gate of the pass transistor.

17. The method of claim 15, wherein:
the set of one or more circuits includes components of a charge pump, the components of the charge pump including a plurality of serially coupled charge pump stages arranged to pump charge from a first stage to a last stage of the plurality;
a particular stage of the plurality of serially coupled charge pump stages includes:
- a first transistor selectively electrically coupling an input node of the particular stage and an output node of the particular stage; and
- a second transistor selectively electrically coupling the input node and a gate of the first transistor;

the particular stage is in a well surrounded by a plurality of well contacts; and
the input node is defined by a first region in the well, the output node is defined by a second region in the well, the first region and the second region on opposite sides of the gate of the first transistor, the first region having a first distance from a nearest well contact of the plurality of well contacts averaged along a first perimeter of the first region, the second region having a second distance from another nearest well contact of the plurality of well contacts averaged along a second perimeter of the first region, the first distance shorter than the second distance.

18. The method of claim 15, wherein:
the set of one or more circuits includes components of a charge pump, the components of the charge pump including a plurality of serially coupled charge pump stages arranged to pump charge from a first stage to a last stage of the plurality;
a particular stage of the plurality of serially coupled charge pump stages includes a first transistor selectively electrically coupling an input node of the particular stage and an output node of the particular stage, and a second transistor selectively electrically coupling the input node and a gate of the first transistor;
the particular stage is in a well surrounded by a plurality of well contacts; and
the input node is defined by a first region in the well, the output node is defined by a plurality of second regions in the well, and the first region is between the plurality of second regions.

19. The method of claim 15, wherein:
the on-chip power source includes a plurality of parallel current sources; and
the integrated circuit includes an additional set of one or more memory settings that indicates whether a particular parallel current source of the plurality of parallel current sources provides current that is included in a regulated current.

20. The method of claim 15, wherein:
the on-chip power source includes:
- a reference current source; and
- a plurality of transistors having at least two different widths;

at least a first transistor of the plurality of transistors is in series with the reference current source; and
at least a second transistor of the plurality of transistors provides an output current determined by a ratio of the at least two different widths of at least the first and the second transistors of the plurality of transistors.

* * * * *